US009553244B2

(12) United States Patent
Morizur et al.

(10) Patent No.: US 9,553,244 B2
(45) Date of Patent: Jan. 24, 2017

(54) BRANCHED POLYCARBONATE COMPOSITIONS HAVING CONVERSION MATERIAL CHEMISTRY AND ARTICLES THEREOF

(71) Applicants: Jean-Francois Morizur, Evansville, IN (US); Peter Hendrikus Theodorus Vollenberg, Eindhoven (NL)

(72) Inventors: Jean-Francois Morizur, Evansville, IN (US); Peter Hendrikus Theodorus Vollenberg, Eindhoven (NL)

(73) Assignee: SABIC GLOBAL TECHNOLOGIES B.V. (NL)

( * ) Notice: Subject to any disclaimer, the term of this patent is extended or adjusted under 35 U.S.C. 154(b) by 0 days.

(21) Appl. No.: 14/278,606

(22) Filed: May 15, 2014

(65) Prior Publication Data

US 2014/0339586 A1 Nov. 20, 2014

Related U.S. Application Data

(60) Provisional application No. 61/824,310, filed on May 16, 2013.

(51) Int. Cl.
*H01L 33/50* (2010.01)
*C08L 69/00* (2006.01)
*G02B 1/04* (2006.01)

(52) U.S. Cl.
CPC ............. *H01L 33/502* (2013.01); *C08L 69/00* (2013.01); *G02B 1/04* (2013.01); *H01L 33/501* (2013.01)

(58) Field of Classification Search
CPC ...... H01L 33/502; H01L 33/501; C08L 69/00; G02B 1/04
See application file for complete search history.

(56) References Cited

U.S. PATENT DOCUMENTS

| 489,803 | A | 1/1893 | Gillespie et al. |
| 8,250,101 | B2 | 7/1906 | Snow |
| 3,049,568 | A | 8/1962 | Apel et al. |
| 3,394,089 | A | 7/1968 | McNutt et al. |
| 3,673,262 | A | 6/1972 | Prahl et al. |
| 3,839,247 | A | 10/1974 | Bialous et al. |
| 4,045,379 | A | 8/1977 | Kwantes et al. |
| 4,052,466 | A | 10/1977 | Sun |
| 4,076,686 | A | 2/1978 | Calkins |
| 4,191,843 | A | 3/1980 | Kwantes et al. |
| 4,294,995 | A | 10/1981 | Faler et al. |
| 4,308,404 | A | 12/1981 | Kwantes et al. |
| 4,308,405 | A | 12/1981 | Kwantes |
| 4,346,247 | A | 8/1982 | Faler et al. |
| 4,365,099 | A | 12/1982 | Faler et al. |
| 4,391,997 | A | 7/1983 | Mendiratta |
| 4,396,728 | A | 8/1983 | Faler |
| 4,400,555 | A | 8/1983 | Mendiratta |
| 4,423,252 | A | 12/1983 | Maki et al. |
| 4,424,283 | A | 1/1984 | Faler et al. |
| 4,455,409 | A | 6/1984 | Faler et al. |
| 4,478,956 | A | 10/1984 | Maki et al. |
| 4,584,416 | A | 4/1986 | Pressman et al. |
| 4,590,303 | A | 5/1986 | Mendiratta |
| 4,595,704 | A | 6/1986 | Fazio |
| 4,819,245 | A | 4/1989 | Iimuro et al. |
| 4,820,740 | A | 4/1989 | Li |
| 4,822,923 | A | 4/1989 | Li |
| 5,015,784 | A | 5/1991 | Rudolph et al. |
| 5,064,885 | A | 11/1991 | Muller et al. |
| 5,087,767 | A | 2/1992 | Okamoto et al. |
| 5,212,206 | A | 5/1993 | Rudolph et al. |
| 5,233,096 | A | 8/1993 | Lundquist |
| 5,284,981 | A | 2/1994 | Rudolph et al. |
| 5,288,926 | A | 2/1994 | Patrascu et al. |
| 5,302,774 | A | 4/1994 | Berg et al. |
| 5,344,910 | A | 9/1994 | Sybert |
| 5,364,895 | A | 11/1994 | Stevenson et al. |
| 5,395,857 | A | 3/1995 | Berg et al. |
| 5,414,151 | A | 5/1995 | Pressman et al. |
| 5,414,152 | A | 5/1995 | Cipullo |
| 5,424,006 | A | 6/1995 | Murayama et al. |

(Continued)

FOREIGN PATENT DOCUMENTS

| CN | 101205358 A | 6/2008 |
| CN | 101885907 A | 11/2010 |

(Continued)

OTHER PUBLICATIONS

Chou et al., "The optimum conditions for solid-state-prepared (Y3-xCex)Al5O12 phosphor using the Taguchi method", Advanced Powder Technology, vol. 23, Issue 1, Jan. 2012, pp. 97-103.
International Search Report PCT/US2014/038147 international filing date May 15, 2014, maling date Aug. 19, 2014, 4 pages.
Written Opinion; PCT/US2014/038147 international filing date May 15, 2014, maling date Aug. 19, 2014, 4 pages.
De Brouwer et al., U.S. Appl. No. 14/797,417 entitled "Polycarbonate Compositions Containing Conversions Material Chemistry and Having Enhanced Optical Properties, Methods of Making and Articles Comprising the Same" filed Jul. 13, 2015.

(Continued)

*Primary Examiner* — Michael C Miggins
(74) *Attorney, Agent, or Firm* — Cantor Colburn LLP

(57) ABSTRACT

Disclosed herein is a light emitting device, comprising: a lighting element located in a housing, wherein the housing is formed from a plastic composition comprising: a conversion material, and a polycarbonate composition comprising: a flame retardant comprising a sulfonate salt and three polycarbonates. The first polycarbonate has a branching level of greater than or equal to 2%, a weight average molecular weight of 20,000 g/mole to 55,000 g/mole and a peak melt viscosity of greater than or equal to 25,000 poise. The second polycarbonate has a glass transition temperature greater than or equal to 170° C. The third polycarbonate has a branching level of 0 to less than 2% and a molecular weight of 17,000 to 40,000 g/mol.

32 Claims, No Drawings

(56) References Cited

U.S. PATENT DOCUMENTS

| | | |
|---|---|---|
| 5,438,086 A | 8/1995 | Stevenson et al. |
| 5,455,282 A | 10/1995 | Berg et al. |
| 5,463,140 A | 10/1995 | Wehmeyer et al. |
| 5,470,938 A | 11/1995 | Sakashita et al. |
| 5,475,154 A | 12/1995 | Lundquist et al. |
| 5,589,517 A | 12/1996 | Sugawara et al. |
| 5,631,338 A | 5/1997 | Inoue et al. |
| 5,672,664 A | 9/1997 | DeRudder et al. |
| 5,698,600 A | 12/1997 | Wulff et al. |
| 5,747,632 A | 5/1998 | Adachi et al. |
| 5,780,690 A | 7/1998 | Berg et al. |
| 5,783,733 A | 7/1998 | Kissinger |
| 5,883,218 A | 3/1999 | Gordon et al. |
| 5,914,431 A | 6/1999 | Fennhoff |
| 5,939,494 A | 8/1999 | Wehmeyer et al. |
| 6,066,861 A | 5/2000 | Hohn et al. |
| 6,069,225 A | 5/2000 | Gerace et al. |
| 6,133,190 A | 10/2000 | Wehmeyer et al. |
| 6,174,987 B1 | 1/2001 | Gordon et al. |
| 6,211,417 B1 | 4/2001 | Fengler et al. |
| 6,329,556 B1 | 12/2001 | Sakura et al. |
| 6,373,262 B1 | 4/2002 | Herring et al. |
| 6,414,199 B1 | 7/2002 | Saruwatari |
| 6,429,343 B1 | 8/2002 | Iwahara |
| 6,486,222 B2 | 11/2002 | Kissinger et al. |
| 6,586,637 B2 | 7/2003 | Iwahara |
| 6,613,823 B1 | 9/2003 | Battiste et al. |
| 6,653,513 B1 | 11/2003 | Iwahara |
| 6,653,613 B1 | 11/2003 | Bucourt et al. |
| 6,676,852 B2 | 1/2004 | Brown et al. |
| 6,692,659 B2 | 2/2004 | Brown et al. |
| 6,706,846 B2 | 3/2004 | Brack et al. |
| 6,710,211 B1 | 3/2004 | Heydenreich et al. |
| 6,716,368 B1 | 4/2004 | Schottland et al. |
| 6,727,394 B2 | 4/2004 | Saruwatari |
| 6,730,816 B2 | 5/2004 | Lundquist |
| 6,740,784 B2 | 5/2004 | Iwahara et al. |
| 6,995,294 B2 | 2/2006 | Webb et al. |
| 7,112,702 B2 | 9/2006 | Carvill et al. |
| 7,112,703 B2 | 9/2006 | Neumann et al. |
| 7,129,382 B2 | 10/2006 | Iwahara et al. |
| 7,227,046 B2 | 6/2007 | Commarieu |
| 7,491,837 B2 | 2/2009 | Schlosberg et al. |
| 7,852,428 B2 | 12/2010 | Byoun et al. |
| 7,879,927 B2 | 2/2011 | Vlottes et al. |
| 7,923,586 B2 | 4/2011 | Stahlbush et al. |
| 7,959,827 B2 | 6/2011 | Comanzo et al. |
| 7,964,273 B2 | 6/2011 | Kogure et al. |
| 7,989,531 B2 | 8/2011 | Bersted et al. |
| 8,735,634 B2 | 5/2014 | Hasyagar et al. |
| 9,006,378 B2 | 4/2015 | Van Den Bogerd et al. |
| 2002/0147256 A1 | 10/2002 | Eckel et al. |
| 2003/0180542 A1 | 9/2003 | Pickett et al. |
| 2003/0232957 A1 | 12/2003 | Silvi et al. |
| 2004/0077820 A1 | 4/2004 | Silva et al. |
| 2004/0116751 A1 | 6/2004 | Carvill et al. |
| 2004/0135504 A1 | 7/2004 | Tamaki et al. |
| 2004/0181100 A1 | 9/2004 | Lundquist |
| 2004/0227465 A1 | 11/2004 | Menkara et al. |
| 2005/0035331 A1 | 2/2005 | Sun |
| 2005/0070615 A1 | 3/2005 | Terajima et al. |
| 2005/0177007 A1 | 8/2005 | Neumann et al. |
| 2005/0215833 A1 | 9/2005 | Neumann et al. |
| 2006/0135690 A1 | 6/2006 | Juikar et al. |
| 2006/0247356 A1 | 11/2006 | Agarwal |
| 2006/0263547 A1 | 11/2006 | Cojocariu et al. |
| 2007/0004941 A1 | 1/2007 | Blaschke et al. |
| 2007/0010619 A1 | 1/2007 | Chatterjee et al. |
| 2007/0123686 A1 | 5/2007 | Mahood et al. |
| 2007/0139949 A1 | 6/2007 | Tanda et al. |
| 2007/0299169 A1 | 12/2007 | Ohira et al. |
| 2008/0029720 A1 | 2/2008 | Li |
| 2008/0081855 A1 | 4/2008 | Mullen |
| 2008/0113117 A1 | 5/2008 | Coenjarts et al. |
| 2009/0043053 A1 | 2/2009 | Gorny et al. |
| 2009/0054586 A1 | 2/2009 | Hein et al. |
| 2009/0278444 A1 | 11/2009 | Forrest et al. |
| 2010/0006875 A1 | 1/2010 | Naum et al. |
| 2010/0137549 A1 | 6/2010 | Takahashi et al. |
| 2011/0071261 A1 | 3/2011 | Hoeks et al. |
| 2011/0127904 A1 | 6/2011 | Tsai |
| 2011/0140593 A1 | 6/2011 | Negley et al. |
| 2011/0151262 A1 | 6/2011 | Heuer et al. |
| 2011/0278614 A1 | 11/2011 | Maier-Richter et al. |
| 2012/0043552 A1 | 2/2012 | David et al. |
| 2012/0126260 A1 | 5/2012 | Hussell et al. |
| 2012/0252985 A1 | 10/2012 | Rosenquist et al. |
| 2012/0283485 A1 | 11/2012 | Hasyagar et al. |
| 2013/0035441 A1 | 2/2013 | De Brouwer et al. |
| 2013/0094179 A1 | 4/2013 | Dai et al. |
| 2013/0108820 A1 | 5/2013 | Belfadhel et al. |
| 2013/0200415 A1 | 8/2013 | Evans et al. |
| 2013/0221837 A1 | 8/2013 | De Brouwer et al. |
| 2013/0270591 A1 | 10/2013 | De Brouwer et al. |
| 2014/0051802 A1 | 2/2014 | De Brouwer et al. |
| 2014/0051803 A1 | 2/2014 | De Brouwer et al. |
| 2014/0117393 A1 | 5/2014 | Van Heerbeek et al. |
| 2014/0226342 A1 | 8/2014 | Flores et al. |
| 2015/0070933 A1 | 3/2015 | Van Den Bogerd et al. |
| 2015/0318450 A1 | 11/2015 | De Brouwer et al. |

FOREIGN PATENT DOCUMENTS

| | | |
|---|---|---|
| CN | 102134383 A | 7/2011 |
| CN | 202091807 | 12/2011 |
| DE | 102006016548 A1 | 10/2006 |
| EP | 0320658 A1 | 6/1989 |
| EP | 0475893 A1 | 3/1992 |
| EP | 0313165 B1 | 1/1993 |
| EP | 0523931 A2 | 1/1993 |
| EP | 0693470 B1 | 5/1998 |
| EP | 0885929 A1 | 12/1998 |
| EP | 0676237 B1 | 3/1999 |
| EP | 1160229 A1 | 12/2001 |
| EP | 1201303 A1 | 5/2002 |
| EP | 1234845 A2 | 8/2002 |
| EP | 1273563 A1 | 1/2003 |
| EP | 0788839 B1 | 5/2003 |
| EP | 1371623 A1 | 12/2003 |
| EP | 1459805 A1 | 9/2004 |
| EP | 1500671 A1 | 1/2005 |
| EP | 2143750 A1 | 1/2005 |
| EP | 1222960 B1 | 8/2005 |
| EP | 1808726 A1 | 7/2007 |
| EP | 1925874 A1 | 5/2008 |
| EP | 1520617 B1 | 2/2009 |
| EP | 2248841 A1 | 11/2010 |
| FR | 2685221 A1 | 6/1993 |
| FR | 2685323 A1 | 6/1993 |
| GB | 1377227 A | 12/1974 |
| JP | 5271132 A | 10/1993 |
| JP | 5294875 A | 11/1993 |
| JP | 5294876 A | 11/1993 |
| JP | 8038910 A | 2/1996 |
| JP | 08071433 A | 3/1996 |
| JP | 08319248 A | 12/1996 |
| JP | 08325185 A | 12/1996 |
| JP | 10211434 A | 8/1998 |
| JP | 10251180 A | 9/1998 |
| JP | 10314595 A | 12/1998 |
| JP | 10328573 A | 12/1998 |
| JP | 11179210 A | 7/1999 |
| JP | 11246458 A | 9/1999 |
| JP | 11255748 A | 9/1999 |
| JP | 2000281607 A | 10/2000 |
| JP | 2000281608 A | 10/2000 |
| JP | 2000319216 A | 11/2000 |
| JP | 2001233812 A | 8/2001 |
| JP | 2004149623 A | 5/2004 |
| JP | 2004231935 A | 8/2004 |
| JP | 2005037591 A | 2/2005 |
| JP | 2005048154 A | 2/2005 |
| JP | 2005082713 A | 3/2005 |
| JP | 2005115051 A | 4/2005 |

(56) References Cited

FOREIGN PATENT DOCUMENTS

| | | |
|---|---|---|
| JP | 2006339033 A | 12/2006 |
| JP | 2008184482 A | 8/2008 |
| JP | 2011029051 A | 2/2011 |
| KR | 20110033772 A | 3/2011 |
| WO | 9209550 A1 | 6/1992 |
| WO | 9708122 A1 | 3/1997 |
| WO | 0050372 A1 | 8/2000 |
| WO | 0059853 A1 | 10/2000 |
| WO | 2007136934 A1 | 11/2007 |
| WO | 2008100165 A1 | 8/2008 |
| WO | 2009045791 A1 | 4/2009 |
| WO | 2011082204 A1 | 7/2011 |
| WO | 2011134674 A1 | 11/2011 |
| WO | 2012065292 A1 | 5/2012 |
| WO | 2012150559 A1 | 11/2012 |
| WO | 2012150560 A1 | 11/2012 |
| WO | 2013021332 A1 | 2/2013 |
| WO | 2013061274 A1 | 5/2013 |
| WO | 2013173615 A1 | 11/2013 |
| WO | 2014031730 A1 | 2/2014 |

OTHER PUBLICATIONS

Anonymous, "Polycarbonate preparation with a low yellowness index," Research Disclosure, Mason Publications, Hampshire GB vol. 449, No. 49 (Sep. 1, 2001) ISSN: 0374-4353 pp. 1-3.
Chinese U.S. Pat. No. 102134383 (A); Publication Date: Jul. 27, 2011; Abstract Only; 1 Page.
DuPont T-Pure—Titanium Dioxide; Polymers, Light and the Science of TiO2; Copyright 2007; 20 Pages.
English Abstract of JP08038910(A); Date of Publication: Feb. 13, 1996; 1 Page.
English Abstract of JP08071433(A); Date of Publication: Mar. 19, 1996; 1 Page.
English Abstract of JP08325185(A); Date of Publication: Dec. 10, 1996; 2 Pages.
English Abstract of JP10211434(A); Date of Publication: Aug. 11, 1998; 2 Pages.
English Abstract of JP10251180(A); Date of Publication: Sep. 22, 1998; 1 Page.
English Abstract of JP10314595(A); Date of Publication: Dec. 2, 1998; 2 Pages.
English Abstract of JP10328573(A); Date of Publication: Dec. 15, 1998; 1 Page.
English Abstract of JP11179210(A); Date of Publication: Jul. 6, 1999; 2 Pages.
English Abstract of JP11246458(A); Date of Publication: Sep. 14, 1999; 1 Page.
English Abstract of JP11255748(A); Date of Publication: Sep. 21, 1999; 1 Page.
English Abstract of JP2000281607(A); Date of Publication: Oct. 10, 2000; 1 Page.
English Abstract of JP2000281608(A); Date of Publication: Oct. 10, 2000; 1 Page.
English Abstract of JP2000319216(A); Date of Publication: Nov. 21, 2000; 1 Page.
English Abstract of JP2001233812(A); Date of Publication: Aug. 28, 2001; 1 Page.
English Abstract of JP5271132(A); Date of Publication: Oct. 19, 1993; 2 Pages.
English Abstract of JP5294875(A); Date of Publication: Nov. 9, 1993; 2 Pages.
English Abstract of JP5294876(A); Date of Publication: Nov. 9, 1993; 1 Page.
Japanese U.S. Pat. No. 2005082713 (A); Publication Date: 2005-03-31; Abstract Only; 2 Pages.
Machine Translation of JP08319248(A); Date of Publication: Dec. 3, 1996; 8 Pages.
Poskrobko et al.; "High-Performance Liquid Chromatography with Multi-Wavelength Detection of the Bisphenol A Impurities"; Journal of Chromatography A; vol. 883; 2000; pp. 291-297.
Anderson et al.; "Quantitative Analysis of Commercial Bisphenol A by Paper Chromatography"; Analytical Chemistry; vol. 31, No. 7; 1959; p. 1214-1217.
Brunelle, D.J.: "Polycarbonates", Encyclopedia of Polymer Science and Technology, Jan. 1, 2006, pp. I.1-33, XP002525090, DOI: 10.1002/0471440264PST255.PUB2, Retrieved from the Internet: URL: http://mrw.interscience. wiley.com/emrw/9780471440260/epst/article/p.
Brydia; "Determination of Bisphenol A and Impurities by Gas Chromatography of Their Trimethylsilyl Ether Derivatives" Analytical Chemistry; vol. 40, No. 14; 1968; pp. 2212-2215.
Chan et al., "Facile Quantitative Analysis of Hydroxyl End Groups of Poly (2,6-dimethyl-1,4-phenylene oxide)s by 31P NMR Spectroscopy", Macromolecules (1994), vol. 27, pp. 6371-6375.
Chinese U.S. Pat. No. 101205358 (A); Publication Date: Jun. 25, 2008; Abstract Only; 1 Page.
Chinese U.S. Pat. No. 101885907 (A); Publication Date: Nov. 17, 2010; Abstract Only; 1 Page.
Chinese U.S. Pat. No. 202091807 (U); Publication Date: Dec. 28, 2011; Abstract Only; 1 Page.
Cytec; Cyasorb UV-5411 Product Safety Summary; Cytec; Dec. 2012; pp. 1-5.
De Brouwer et al.; "Lexan* Polycarbonate for Optical Applications"; SABIC Innovative Plastics; Received Aug. 2, 2011; 5 pages.
Factor et al.; "The Use of 31 P NMR to Identify Color Bodies in y-irradiated Bisphenol-A Polycarbonate*"; Polymer Degradation and Stability; vol. 57; 1997; pp. 83-86.
Factor; "Search for the Sources of Color in Thermally Aged, Weathered and y-Ray Irradiated Bisphenol A Polycarbonate"; Die Angewandte Makromolekulare Chemie; vol. 232; 1995; pp. 27-43.
Godinez et al.; "Experimental Study of the Influence of Raw Material Impurities on Yellowness Index of Transesterification Polycarbonate"; Journal of Applied Polymer Science; vol. 119; 2011; pp. 1348-1356.
Japanese U.S. Pat. No. 2004149623 (A); Publication Date: May 27, 2004; Abstract Only; 1 Page.
Japanese U.S. Pat. No. 2004231935 (A); Publication Date: Aug. 19, 2004; Abstract Only; 1 Page.
Japanese U.S. Pat. No. 2005037591 (A); Publication Date: Feb. 10, 2005; Abstract Only; 2 Pages.
Japanese U.S. Pat. No. 2005048154 (A); Publication Date: Feb. 24, 2005; Abstract Only; 1 Page.
Japanese U.S. Pat. No. 2005115051 (A); Publication Date: Apr. 28, 2005; Abstract Only; 1 Page.
Japanese U.S. Pat. No. 2006339033 (A); Publication Date: Dec. 14, 2006; Abstract Only; 2 Pages.
Japanese U.S. Pat. No. 2008184482 (A); Publication Date: Aug. 14, 2008; Abstract Only; 1 Page.
Japanese U.S. Pat. No. 2011029051 (A); Publication Date: Feb. 10, 2011; Abstract Only; 2 Pages.
Li et al.; "Design of Mechanically Robust High-Tg Polymers: Synthesis and Dynamic Machanical Relaxation Behavior of Glassy Poly(ester carbonate)s with Cyclohexylene Rings in the Backbone"; Macromolecules; vol. 36; 2003; pp. 9411-9420.
Liptak et al.; "Absolute pKa Determination for Substituted Phenols"; J. Am. Chem. Soc.; vol. 124; 2002; pp. 6421-6427.
Machine Translation of FR2685221(A1); Date of Publication: Jun. 25, 1993; 26 Pages.
Machine Translation of FR2685323(A1); Date of Publication: Jun. 25, 1993; 26 Pages.
Nowakowska et al.; "Studies of Some Impurities in Commercial Bisphenol-A"; Polish Journal of Applied Chemistry; vol. XL, No. 3; 1996; pp. 247-254.

BRANCHED POLYCARBONATE COMPOSITIONS HAVING CONVERSION MATERIAL CHEMISTRY AND ARTICLES THEREOF

CROSS REFERENCED TO RELATED APPLICATION

This application is a Non-Provisional application which claims the benefit of U.S. Provisional Patent Application Ser. No. 61/824,310 filed May 16, 2013, which is incorporated herein by reference.

BACKGROUND

The present disclosure generally relates to polycarbonate compositions, and more particularly, to polycarbonate compositions containing conversion material chemistry and having enhanced optical properties, methods of manufacture, and uses thereof.

A use of polycarbonate is with lighting devices such as those that use light emitting diodes (LEDs). Light emitting diodes (LEDs) are currently used as replacements for incandescent light bulbs and fluorescent lamps. LEDs are semiconductor devices that emit incoherent narrow-spectrum light when electrically biased in the forward direction of their p-n junctions (boundary between P-type and N-type semiconductor), and are thus referred to as solid-state lighting devices.

When a light-emitting diode is forward biased (switched on), electrons are able to recombine with electron holes within the device, releasing energy in the form of photons. This effect is called electroluminescence and the color of the light (corresponding to the energy of the photon) is determined by the energy gap of the semiconductor. An LED is often small in area (less than 1° square millimeter ($mm^2$)), and integrated optical components may be used to shape its radiation pattern. LEDs powerful enough for room lighting are relatively expensive and require more precise current and heat management than compact fluorescent lamp sources of comparable output.

There is a need for polycarbonate compositions having enhanced optical properties, methods of making and articles comprising the polycarbonate compositions wherein in these compositions have flame retardance at very low thicknesses. There is also a need for polycarbonate containing material that meets these industry requirements as well as processes that effectuate the manufacture of materials that meet industry requirements.

SUMMARY

Disclosed herein is a light emitting device comprising: a lighting element located in a housing, wherein the housing is formed from a plastic composition. The plastic composition comprises: a conversion material, wherein the conversion material comprises yttrium aluminum garnet (YAG) doped with a rare earth element, terbium aluminum garnet doped with a rare earth element, silicate (BOSE) doped with a rare earth element, nitrido silicate doped with a rare earth element; nitride orthosilicate doped with a rare earth element, oxonitridoaluminosilicate doped with a rare earth element, or a combination thereof; and a polycarbonate composition. The polycarbonate composition comprises: a flame retardant comprising a sulfonate salt; 15 to 50 weight percent of a first polycarbonate, wherein the first polycarbonate comprises structural units of formula (I)

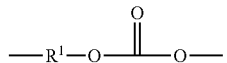

wherein at least 60 percent of the total number of $R^1$ groups comprise aromatic groups and the balance thereof are aliphatic or alicyclic groups, and terminal groups derived from an end-capping agent, wherein the first polycarbonate has a branching level of greater than or equal to 2%, a weight average molecular weight of 20,000 to 55,000 g/mol as measured by gel permeation chromatography using polycarbonate standards, and a peak melt viscosity greater than or equal to 25,000 poise when measured using a parallel plate melt rheology test at a heating rate of 10 degrees C/minute, a temperature of 350 to 450 degree C., a frequency of 3 radians/second and a strain amplitude of 9%; 20 to 50 weight percent of a second polycarbonate having a glass transition temperature greater than or equal to 170° C., wherein the second polycarbonate comprises structural units derived from HO-$A^1$-$Y^1$-$A^2$-OH and structural units derived from HO-$A^1$-$Y^2$-$A^2$-OH wherein each of $A^1$ and $A^2$ is a monocyclic divalent aryl group, $Y^1$ is an aliphatic bridging group or bridging group comprising one to three atoms with the proviso that at least one of the atoms is a hetero atom, and $Y^2$ is an aromatic group having 6 to 30 carbon atoms, and 15 to 50 weight percent of a third polycarbonate comprising structural units derived from bisphenol A and having a branching level of 0 to less than 2%, and a molecular weight of 17,000 to 40,000 g/mol as measured by gel permeation chromatography using polycarbonate standards, wherein weight percent is based on the combined weight of the first, second and third polycarbonates and the composition has a heat distortion temperature greater than or equal to 145° C., ductility greater than or equal to 90% at 23 degrees C., multi-axial impact greater than or equal to 50 J/m at 23° C., and a molded article of the composition has a UL 94 V0 rating at a thickness of 1.5 mm. After the conversion material has been exposed to an excitation source, the conversion material has a luminescence lifetime of less than $10^{-4}$ seconds when the excitation source is removed.

In some embodiments the polycarbonate composition comprises potassium perfluorobutane sulfonate; 15 to 50 weight percent of a first polycarbonate, wherein the first polycarbonate comprises structural units of formula (I)

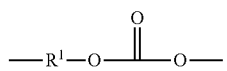

wherein greater than or equal to 60 percent of the total number of $R^1$ groups comprise aromatic groups and the balance thereof are aliphatic or alicyclic groups, terminal groups derived from an end-capping agent, and wherein the first polycarbonate has a branching level of greater than or equal to 2%, a weight average molecular weight of 20,000 g/mole to 55,000 g/mole as measured by gel permeation chromatography using polycarbonate standards and a peak melt viscosity of greater than or equal to 25,000 poise when measured using a parallel plate melt rheology test at a heating rate of 10° C./min, a temperature of 350° C. to 450° C., a frequency of 3 radians/second and a strain amplitude of 9%; 20 to 50 weight percent of a second polycarbonate having a glass transition temperature greater than or equal to 170° C., wherein the second polycarbonate comprises structural units derived from HO-$A^1$-$Y^1$-$A^2$-OH and structural units derived from HO-A$^1$-Y$^2$-A$^2$-OH wherein each of A$^1$ and A$^2$ is a monocyclic divalent aryl group, Y$^1$ is an aliphatic bridging group or bridging group comprising one to three atoms with the proviso that greater than or equal to one of the atoms is a hetero atom, and Y$^2$ is an aromatic group having 6 to 30 carbon atoms, and 15 to 50 weight percent of a third polycarbonate comprising structural units derived from bisphenol A and having a branching level of 0 to less than 2% and a molecular weight of 17,000 to 40,000 as measured by gel permeation chromatography using polycarbonate standards wherein weight percent is based on the combined weight of the first, second and third polycarbonates and the composition has a heat distortion temperature greater than or equal to 145° C., ductility greater than or equal to 90% at 23° C., multi-axial impact greater than or equal to 50 Joules per meter (Jim) at 23° C. ° C., and a molded article of the composition has a UL 94 V0 rating at a thickness of 1.0 mm.

In some embodiments the polycarbonate composition comprises potassium sulfone sulfonate; 15 to 50 weight percent of a first polycarbonate, wherein the first polycarbonate comprises structural units of formula (I)

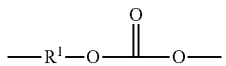

wherein greater than or equal to 60 percent of the total number of R$^1$ groups comprise aromatic groups and the balance thereof are aliphatic, alicyclic, or aromatic groups, terminal groups derived from an end-capping agent, and structural units derived from a branching agent; 20 to 50 weight percent of a second polycarbonate having a glass transition temperature greater than or equal to 170° C., wherein the second polycarbonate comprises structural units derived from HO-A$^1$-Y$^1$-A$^2$-OH and structural units derived from HO-A$^1$-Y$^2$-A$^2$-OH wherein each of A$^1$ and A$^2$ is a monocyclic divalent aryl group, Y$^1$ is an aliphatic bridging group or bridging group comprising one to three atoms with the proviso that greater than or equal to one of the atoms is a hetero atom, and Y$^2$ is an aromatic group having 6 to 30 carbon atoms, and 15 to 50 weight percent of a third polycarbonate comprising structural units derived from bisphenol A and having a branching level of 0 to less than 2% and a molecular weight of 17,000 to 40,000 as measured by gel permeation chromatography using polycarbonate standards wherein weight percent is based on the combined weight of the first, second and third polycarbonates and the composition has a heat distortion temperature greater than or equal to 145° C., ductility greater than or equal to 90% at 23° C., multi-axial impact greater than or equal to 50 Joules per meter (Jim) at 23° C., and a molded article of the composition has a UL 94 V0 rating at a thickness of 1.2 mm.

DETAILED DESCRIPTION

As stated above, disclosed herein is a polycarbonate composition comprising a flame retardant comprising a sulfonate salt and three polycarbonates. The first polycarbonate is branched and end-capped. The second polycarbonate has a high glass transition temperature. The third polycarbonate improves the ductility of the composition with little or no negative impact on the other physical properties. The combination of these four components yields a composition having a combination of high melt flow, ductility, glass transition temperature, impact strength, and surprisingly good flame retardance at low thickness. This is highly surprising since good flame retardance is generally harder to achieve at low thickness and when the composition has a high melt flow the expectation is that the flame retardance is even harder to achieve due to an increased propensity to form flaming drips.

A. First Polycarbonate

The first polycarbonate comprises structural units of formula (1):

wherein greater than or equal to 60 percent of the total number of R$^1$ groups contains aromatic groups and the balance thereof are aliphatic or alicyclic groups. In one embodiment, the polycarbonate is derived from bisphenol A. In one embodiment, each R$^1$ group is a divalent aromatic group, for example derived from an aromatic dihydroxy compound of the formula (2):

In another embodiment, each R$^1$ group is a divalent aromatic group, for example derived from an aromatic dihydroxy compound of the formula (3):

wherein A$^1$ and A$^2$ are each independently a monocyclic divalent arylene group, and Y$^3$ is a single bond or a bridging group having one or two atoms that separate A$^1$ from A$^2$. In an exemplary embodiment, one atom separates A$^1$ from A$^2$. In another embodiment, when each of A$^1$ and A$^2$ is phenylene, Y$^3$ is para to each of the hydroxyl groups on the phenylenes. Illustrative non-limiting examples of groups of this type are —O—, —S—, —S(O)—, —S(O)$_2$—, —C(O)—, methylene, cyclohexyl-methylene, 2-[2-2-1]-bicycloheptylidene, ethylidene, isopropylidene, neopentylidene, cyclohexylidene, cyclopentadecylidene, cyclododecylidene, and adamantylidene. The bridging group Y$^3$ can be a hydrocarbon group or a saturated hydrocarbon group such as methylene, cyclohexylidene, or isopropylidene.

Included within the scope of formula (3) are bisphenol compounds of general formula (4):

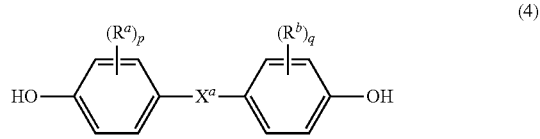

wherein R$^a$ and R$^b$ are each independently a hydrogen atom, a halogen atom, a C$_{1-12}$ alkyl group, or a monovalent hydrocarbon group and can be the same or different; p and q are each independently integers of 0 to 4; and X$^a$ represents a single bond, C$_{3-20}$ cycloalkylidene, or one of the groups of formulas (5) or (6):

(6)

wherein $R^c$ and $R^d$ are each independently hydrogen, $C_{1-12}$ alkyl, $C_{1-12}$ cycloalkyl, $C_{7-12}$ arylalkyl, $C_{1-12}$ heteroalkyl, a cyclic $C_{7-12}$ heteroarylalkyl, or are taken together to represent a $C_{3-20}$ cyclic alkylene group or a heteroatom-containing $C_{3-20}$ cyclic alkylene group comprising carbon atoms and heteroatoms with a valency of two or greater, and $R^e$ is a divalent $C_{1-12}$ hydrocarbon group. In particular, $R^c$ and $R^d$ are each the same hydrogen or $C_{1-4}$ alkyl group, specifically the same $C_{1-3}$ alkyl group, even more specifically, methyl.

In an embodiment, $R^c$ and $R^d$ taken together to represent a $C_{3-20}$ cyclic alkylene group or a heteroatom-containing $C_{3-20}$ cyclic alkylene group comprising carbon atoms and heteroatoms with a valency of two or greater. These groups can be in the form of a single saturated or unsaturated ring, or a fused polycyclic ring system wherein the fused rings are saturated, unsaturated, or aromatic. A specific heteroatom-containing cyclic alkylene group comprises greater than or equal to one heteroatom with a valency of 2 or greater, and greater than or equal to two carbon atoms. Exemplary heteroatoms in the heteroatom-containing cyclic alkylene group include —O—, —S—, and —N(Z)—, where Z is a substituent group selected from hydrogen, hydroxy, $C_{1-12}$ alkyl, $C_{1-12}$ alkoxy, or $C_{1-12}$ acyl.

In a specific exemplary embodiment, $X^a$ is a substituted $C_{3-18}$ cycloalkylidene of the formula (7):

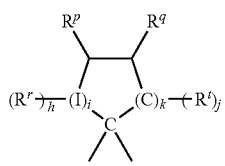

(7)

wherein $R^r$, $R^p$, $R^q$, and $R^t$ are each independently hydrogen, halogen, oxygen, or $C_{1-12}$ alkyl group, with the proviso that greater than or equal to two of $R^r$, $R^p$, $R^q$, and $R^t$ can be taken together to form a fused cycloaliphatic, aromatic, or heteroaromatic ring; I is a direct bond, a carbon, a divalent oxygen, sulfur, or —N(Z)— wherein Z is hydrogen, halogen, hydroxy, $C_{1-12}$ alkyl, $C_{1-12}$ alkoxy, or $C_{1-12}$ acyl; h is 0 to 2, j is 1 or 2, i is an integer of 0 or 1, and k is an integer of 0 to 3. It will be understood that where the fused ring is aromatic, the ring as shown in formula (7) will have an unsaturated carbon-carbon linkage where the ring is fused. When i is 0 and k is 1, the ring as shown in formula (7) contains 4 carbon atoms, when i is 0 and k is 2, the ring as shown contains 5 carbon atoms, and when i is 0 and k is 3, the ring contains 6 carbon atoms. In one embodiment, two adjacent groups (e.g., $R^q$ and $R^t$ taken together) form an aromatic group, and in another embodiment, $R^q$ and $R^t$ taken together form one aromatic group and $R^r$ and $R^p$ taken together form a second aromatic group.

When k is 3 and i is 0, bisphenols containing substituted or unsubstituted cyclohexane units are used, for example bisphenols of formula (8):

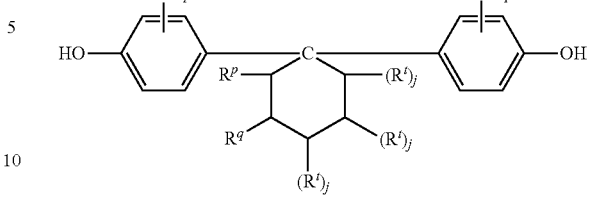

(8)

wherein $R^p$, $R^q$, and $R^t$ are each independently hydrogen, halogen, oxygen, or $C_{1-12}$ alkyl group, with the proviso that greater than or equal to two of $R^p$, $R^q$, and $R^t$ can be together to form a fused cycloaliphatic, aromatic, or heteroaromatic ring, $R^a$ and $R^b$ are each independently a hydrogen atom, a halogen atom, or a monovalent hydrocarbon group, p and q are each independently integers of 0 to 4, and j is 1 or 2. In an embodiment, $R^p$, $R^q$, and $R^t$ are each independently hydrogen, $C_{1-12}$ alkyl, or halogen; and each $R^a$ and $R^b$ is independently hydrogen or $C_{1-12}$ alkyl. When one or more of $R^p$, $R^q$, and $R^t$ is a $C_{1-12}$ alkyl, the $C_{1-12}$ alkyl can be aliphatic or aromatic, straight chain, cyclic, bicyclic, branched, saturated, or unsaturated. Such cyclohexane-containing bisphenols, for example the reaction product of two moles of a phenol with one mole of a hydrogenated isophorone, are useful for making polycarbonate polymers with high glass transition temperatures and high heat distortion temperatures. Cyclohexyl bisphenol containing polycarbonates, or a combination comprising greater than or equal to one of the foregoing with other bisphenol polycarbonates, are supplied by Bayer Co. under the APEC** trade name.

Other useful dihydroxy compounds having the formula (2):

$$HO-R^1-OH \qquad (2)$$

include aromatic dihydroxy compounds of formula (9):

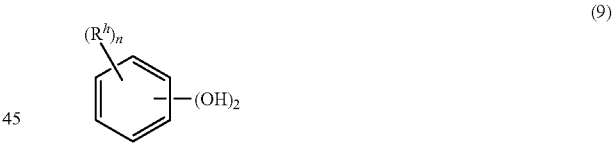

(9)

wherein $R^h$ is each independently a halogen atom, a $C_{1-10}$ hydrocarbyl such as a $C_{1-10}$ alkyl group, a halogen substituted $C_{1-10}$ hydrocarbyl such as a halogen-substituted $C_{1-10}$ alkyl group, and n is 0 to 4. The halogen is usually bromine.

Some illustrative examples of dihydroxy compounds include the following: 4,4'-dihydroxybiphenyl, 1,6-dihydroxynaphthalene, 2,6-dihydroxynaphthalene, bis(4-hydroxyphenyl)methane, bis(4-hydroxyphenyl)diphenylmethane, bis(4-hydroxyphenyl)-1-naphthylmethane, 1,2-bis(4-hydroxyphenyl)ethane, 1,1-bis(4-hydroxyphenyl)-1-phenylethane, 2-(4-hydroxyphenyl)-2-(3-hydroxyphenyl)propane, bis(4-hydroxyphenyl)phenylmethane, 2,2-bis(4-hydroxy-3-bromophenyl)propane, 1,1-bis(hydroxyphenyl)cyclopentane, 1,1-bis(4-hydroxyphenyl)cyclohexane, 1,1-bis(4-hydroxyphenyl)isobutene, 1,1-bis(4-hydroxyphenyl)cyclododecane, trans-2,3-bis(4-hydroxyphenyl)-2-butene, 2,2-bis(4-hydroxyphenyl)adamantine, alpha, alpha'-bis(4-hydroxyphenyl)toluene, bis(4-hydroxyphenyl)acetonitrile, 2,2-bis(3-methyl-4-hydroxyphenyl)propane, 2,2-bis(3-ethyl-4-hydroxyphenyl)propane, 2,2-bis(3-n-propyl-4-hydroxyphenyl)propane, 2,2-bis(3-isopropyl-4-hydroxyphenyl)propane, 2,2-bis(3-sec-butyl-4-hydroxyphenyl)propane, 2,2-bis(3-t-butyl-4-hydroxyphenyl)propane, 2,2-bis(3-cyclohexyl-4-hydroxyphenyl)propane, 2,2-bis(3-allyl-4-hydroxyphenyl)propane, 2,2-bis(3-methoxy-4-hydroxyphenyl)propane, 2,2-bis(4-hydroxyphenyl)hexafluoropropane, 1,1-dichloro-2,2-bis(4-hydroxyphenyl)ethylene, 1,1-dibromo-2,2-bis(4-hydroxyphenyl)ethylene, 1,1-dichloro-2,2-bis(5-phenoxy-4-hydroxyphenyl)ethylene, 4,4'-dihydroxybenzophenone, 3,3-bis(4-hydroxyphenyl)-2-butanone, 1,6-bis(4-hydroxyphenyl)-1,6-hexanedione, ethylene glycol bis(4-hydroxyphenyl)ether, bis(4-hydroxyphenyl)ether, bis(4-hydroxyphenyl)sulfide, bis(4-hydroxyphenyl)sulfoxide, bis(4-hydroxyphenyl)sulfone, 9,9 to bis(4-hydroxyphenyl) fluorine, 2,7-dihydroxypyrene, 6,6'-dihydroxy-3,3,3',3'-tetramethylspiro(bis)indane ("spirobiindane bisphenol"), 3,3-bis(4-hydroxyphenyl)phthalide, 2,6-dihydroxydibenzo-p-dioxin, 2,6-dihydroxythianthrene, 2,7-dihydroxyphenoxathin, 2,7-dihydroxy-9,10-dimethylphenazine, 3,6-dihydroxydibenzofuran, 3,6-dihydroxydibenzothiophene, and 2,7-dihydroxycarbazole, resorcinol, substituted resorcinol compounds such as 5-methyl resorcinol, 5-ethyl resorcinol, 5-propyl resorcinol, 5-butyl resorcinol, 5-t-butyl resorcinol, 5-phenyl resorcinol, 5-cumyl resorcinol, 2,4,5,6-tetrafluoro resorcinol, 2,4,5,6-tetrabromo resorcinol, or the like; catechol; hydroquinone; substituted hydroquinones such as 2-methyl hydroquinone, 2-ethyl hydroquinone, 2-propyl hydroquinone, 2-butyl hydroquinone, 2-t-butyl hydroquinone, 2-phenyl hydroquinone, 2-cumyl hydroquinone, 2,3,5,6-tetramethyl hydroquinone, 2,3,5,6-tetra-t-butyl hydroquinone, 2,3,5,6-tetrafluoro hydroquinone, 2,3,5,6-tetrabromo hydroquinone, and the like, as well as combinations comprising greater than or equal to one of the foregoing dihydroxy compounds.

Specific examples of bisphenol compounds that can be represented by formula (3) include 1,1-bis(4-hydroxyphenyl) methane, 1,1-bis(4-hydroxyphenyl) ethane, 2,2-bis(4-hydroxyphenyl) propane (hereinafter "bisphenol A" or "BPA"), 2,2-bis(4-hydroxyphenyl) butane, 2,2-bis(4-hydroxyphenyl) octane, 1,1-bis(4-hydroxyphenyl) propane, 1,1-bis(4-hydroxyphenyl) n-butane, 2,2-bis(4-hydroxy-1-methylphenyl) propane, 1,1-bis(4-hydroxy-t-butylphenyl) propane, 3,3-bis(4-hydroxyphenyl) phthalimidine, 2-phenyl-3,3-bis(4-hydroxyphenyl) phthalimidine (PPPBP), and 1,1-bis(4-hydroxy-3-methylphenyl)cyclohexane (DMBPC). Combinations comprising greater than or equal to one of the foregoing dihydroxy compounds can also be used.

"Polycarbonate" as used herein includes homopolycarbonates, copolymers comprising different $R^1$ moieties in the carbonate (referred to herein as "copolycarbonates"), and copolymers comprising carbonate units and other types of polymer units, such as ester units. In one specific embodiment, the polycarbonate is a linear homopolymer or copolymer comprising units derived from bisphenol A, in which each of $A^1$ and $A^2$ is p-phenylene and $Y^1$ is isopropylidene in formula (3). More specifically, in this embodiment, greater than or equal to 60%, particularly greater than or equal to 80% of the $R^1$ groups in the polycarbonate are derived from bisphenol A.

Another specific type of copolymer is a polyester carbonate, also known as a polyester-polycarbonate. Such copolymers further contain, in addition to recurring carbonate chain units of the formula (1), repeating units of formula (10):

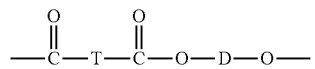

(10)

wherein D is a divalent group derived from a dihydroxy compound, and can be, for example, a $C_{2-10}$ alkylene group, a $C_{6-20}$ alicyclic group, a $C_{6-20}$ aromatic group or a polyoxyalkylene group in which the alkylene groups contain 2 to 6 carbon atoms, specifically 2, 3, or 4 carbon atoms; and T is a divalent group derived from a dicarboxylic acid, and can be, for example, a $C_{2-10}$ alkylene group, a $C_{6-20}$ alicyclic group, a $C_{6-20}$ alkyl aromatic group, a $C_{6-30}$ arylene group, or a $C_{6-20}$ aromatic group.

In one embodiment, D is a $C_{2-30}$ alkylene group having a straight chain, branched chain, or cyclic (including polycyclic) structure. In another embodiment, D is derived from an aromatic dihydroxy compound of formula (4) above. In another embodiment, D is derived from an aromatic dihydroxy compound of formula (9) above.

Examples of aromatic dicarboxylic acids that can be used to prepare the polyester units include isophthalic or terephthalic acid, 1,2-di-(p-carboxyphenyl)ethane, 4,4'-dicarboxydiphenyl ether, 4,4'-bisbenzoic acid, and combinations comprising greater than or equal to one of the foregoing acids. Acids containing fused rings can also be present, such as in 1,4-, 1,5-, or 2,6-naphthalenedicarboxylic acids. Specific dicarboxylic acids are terephthalic acid, isophthalic acid, naphthalene dicarboxylic acid, cyclohexane dicarboxylic acid, or combinations thereof. A specific dicarboxylic acid comprises a combination of isophthalic acid and terephthalic acid wherein the weight ratio of isophthalic acid to terephthalic acid is 91:9 to 2:98. In another specific embodiment, D is a $C_{2-6}$ alkylene group and T is p-phenylene, m-phenylene, naphthalene, a divalent cycloaliphatic group, or a combination thereof. This class of polyester includes the poly(alkylene terephthalates).

The molar ratio of ester units to carbonate units in the copolymers can vary broadly, for example 1:99 to 99:1, specifically 10:90 to 90:10, more specifically 25:75 to 75:25, depending on the desired properties of the final composition.

In a specific embodiment, the polyester unit of a polyester-polycarbonate can be derived from the reaction of a combination of isophthalic and terephthalic diacids (or derivatives thereof) with resorcinol. In another specific embodiment, the polyester unit of a polyester-polycarbonate is derived from the reaction of a combination of isophthalic acid and terephthalic acid with bisphenol A. In a specific embodiment, the polycarbonate units are derived from bisphenol A. In another specific embodiment, the polycarbonate units are derived from resorcinol and bisphenol A in a molar ratio of resorcinol carbonate units to bisphenol A carbonate units of 1:99 to 99:1.

A specific example of a polycarbonate-polyester is a copolycarbonate-polyester-polysiloxane terpolymer comprising carbonate units of formula (1), ester units of formula (10), and polysiloxane (also referred to herein as "polydiorganosiloxane") units of formula (11):

(11)

wherein each occurrence of $R^g$ is each independently a $C_{1-13}$ alkyl group, $C_{1-13}$ alkoxy group, $C_{2-13}$ alkenyl group, $C_{2-13}$ alkenyloxy group, $C_{3-6}$ cycloalkyl group, $C_{3-6}$ cycloalkoxy group, $C_{6-14}$ aryl group, $C_{6-10}$ aryloxy group, $C_{7-13}$ arylalkyl group, $C_{7-13}$ arylalkoxy group, $C_{7-13}$ alkylaryl group, or $C_{7-13}$ alkylaryloxy group wherein any of the aforementioned groups may be fully or partially halogenated with fluorine, chlorine, bromine, or iodine, or a combination thereof. Combinations of the foregoing $R^g$ groups may be used in the same copolymer. In an embodiment, the polysiloxane comprises $R^g$ groups that have a minimum hydrocarbon content. In a specific embodiment, an $R^g$ group with a minimum hydrocarbon content is a methyl group.

The value of E in formula (11) may vary widely depending on the type and relative amount of each component in the thermoplastic composition, the desired properties of the composition, and like considerations. Herein, E has an average value of 4 to 50. In an embodiment, E has an average value of 16 to 50, specifically 20 to 45, and more specifically 25 to 45. In another embodiment, E has an average value of 4 to 15, specifically 5 to 15, more specifically 6 to 15, and still more specifically 7 to 12.

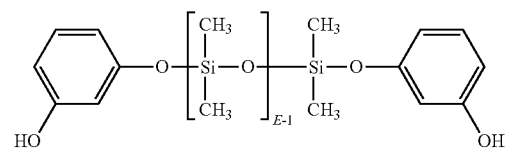

(13)

or, where $Ar^x$ is derived from bisphenol A, from dihydroxy aromatic compounds of formula (14):

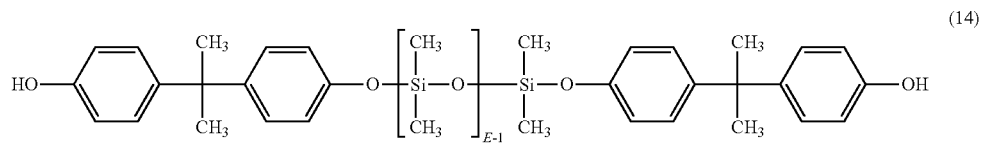

(14)

wherein E is as defined above.

In another embodiment, polydiorganosiloxane units are derived from dihydroxy aromatic compound of formula (15):

In an embodiment, polydiorganosiloxane units are derived from dihydroxy aromatic compound of formula (12):

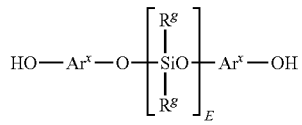

(12)

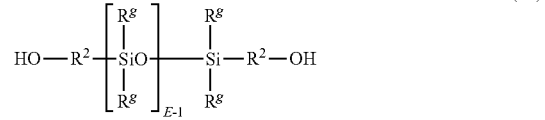

(15)

wherein $R^g$ and E are as described above, and $R^2$ is each independently a divalent $C_{1-30}$ alkylene or $C_{7-30}$ arylene-alkylene, and wherein the polymerized polysiloxane unit is the reaction residue of its corresponding dihydroxy aromatic compound. In a specific embodiment, where $R^2$ is $C_{7-30}$ arylene-alkylene, the polydiorganosiloxane units are derived from dihydroxy aromatic compound of formula (16):

wherein E is as defined above; each $R^g$ may independently be the same or different, and is as defined above; and $Ar^x$ may each independently be the same or different, and is a substituted or unsubstituted $C_{6-30}$ arylene group, wherein the bonds are directly connected to an aromatic moiety. Suitable $Ar^x$ groups in formula (12) may be derived from a $C_{6-30}$ dihydroxy aromatic compound, for example a dihydroxy aromatic compound of formula (3), (4), (8), or (9) above. Combinations comprising greater than or equal to one of the foregoing dihydroxy aromatic compounds may also be used. Exemplary dihydroxy aromatic compounds are resorcinol (i.e., 1,3-dihydroxybenzene), 4-methyl-1,3-dihydroxybenzene, 5-methyl-1,3-dihydroxybenzene, 4,6-dimethyl-1,3-dihydroxybenzene, 1,4-dihydroxybenzene, 1,1-bis(4-hydroxyphenyl) methane, 1,1-bis(4-hydroxyphenyl) ethane, 2,2-bis(4-hydroxyphenyl) propane, 2,2-bis(4-hydroxyphenyl) butane, 2,2-bis(4-hydroxyphenyl) octane, 1,1-bis(4-hydroxyphenyl) propane, 1,1-bis(4-hydroxyphenyl) n-butane, 2,2-bis(4-hydroxy-1-methylphenyl) propane, 1,1-bis(4-hydroxyphenyl)cyclohexane, bis(4-hydroxyphenyl sulfide), and 1,1-bis(4-hydroxy-t-butylphenyl) propane. Combinations comprising greater than or equal to one of the foregoing dihydroxy compounds may also be used. In an embodiment, the dihydroxy aromatic compound is unsubstituted, or is not substituted with non-aromatic hydrocarbon-containing substituents such as, for example, alkyl, alkoxy, or alkylene substituents.

In a specific embodiment, where $Ar^x$ is derived from resorcinol, the polydiorganosiloxane repeating units are derived from dihydroxy aromatic compound of formula (13):

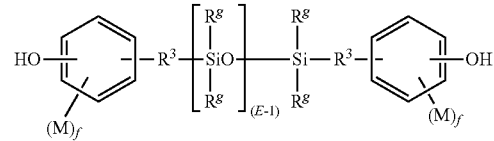

(16)

wherein $R^g$ and E are as defined above. $R^3$ is each independently a divalent $C_{2-8}$ aliphatic group. M is each independently a halogen, cyano, nitro, $C_{1-8}$ alkylthio, $C_{1-8}$ alkyl, $C_{1-8}$ alkoxy, $C_{2-8}$ alkenyl, $C_{2-8}$ alkenyloxy group, $C_{3-8}$ cycloalkyl, $C_{3-8}$ cycloalkoxy, $C_{6-10}$ aryl, $C_{6-10}$ aryloxy, $C_{7-12}$ arylalkyl, $C_{7-12}$ arylalkoxy, $C_{7-12}$ alkylaryl, or $C_{7-12}$ alkylaryloxy, wherein f is each independently 0, 1, 2, 3, or 4.

In an embodiment, M is bromo or chloro, an alkyl group such as methyl, ethyl, or propyl, an alkoxy group such as methoxy, ethoxy, or propoxy, or an aryl group such as phenyl, chlorophenyl, or tolyl; $R^3$ is a dimethylene, trimethylene or tetramethylene group; and $R^g$ is a $C_{1-8}$ alkyl, haloalkyl such as trifluoropropyl, cyanoalkyl, or aryl such as phenyl, chlorophenyl, or tolyl. In another embodiment, $R^g$ is methyl, or a combination of methyl and trifluoropropyl, or a combination of methyl and phenyl. In still another embodiment, M is methoxy, n is 0 or 1, $R^3$ is a divalent $C_{1-3}$ aliphatic group, and $R^g$ is methyl.

In a specific embodiment, the polydiorganosiloxane units are derived from a dihydroxy aromatic compound of formula (17):

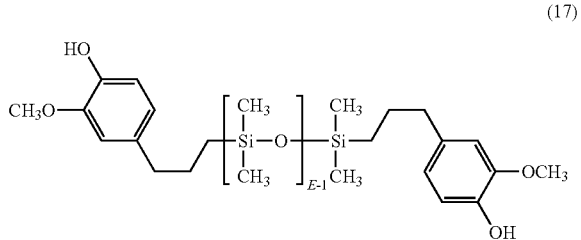

(17)

wherein E is as described above.

In another specific embodiment, the polydiorganosiloxane units are derived from dihydroxy aromatic compound of formula (18):

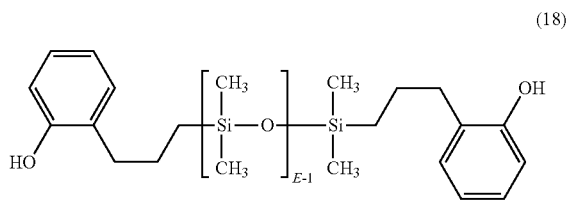

(18)

wherein E is as defined above.

Dihydroxy polysiloxanes typically can be made by functionalizing a substituted siloxane oligomer of formula (19):

(19)

wherein $R^g$ and E are as previously defined, and W is hydrogen, halogen (Cl, Br, I), or carboxylate. Exemplary carboxylates include acetate, formate, benzoate, and the like. In an exemplary embodiment, where W is H, compounds of formula (19) may be prepared by platinum catalyzed addition with an aliphatically unsaturated monohydric phenol. Suitable aliphatically unsaturated monohydric phenols included, for example, eugenol, 2-allylphenol, 4-allylphenol, 4-allyl-2-methylphenol, 4-allyl-2-phenylphenol, 4-allyl-2-bromophenol, 4-allyl-2-t-butoxyphenol, 4-phenyl-2-allylphenol, 2-methyl-4-propenylphenol, 2-allyl-4,6-dimethylphenol, 2-allyl-4-bromo-6-methylphenol, 2-allyl-6-methoxy-4-methylphenol, and 2-allyl-4,6-dimethylphenol. Combinations comprising greater than or equal to one of the foregoing may also be used. Where W is halogen or carboxylate, functionalization may be accomplished by reaction with a dihydroxy aromatic compound of formulas (3), (4), (8), (9), or a combination comprising greater than or equal to one of the foregoing dihydroxy aromatic compounds. In an exemplary embodiment, compounds of formula (12) may be formed from an alpha, omega-bisacetoxypo lydiorangonosiloxane, and a dihydroxy aromatic compound under phase transfer conditions.

In a specific embodiment, copolycarbonate terpolymers include those with polycarbonate units of formula (1) wherein $R^1$ is a $C_{6-30}$ arylene group, polysiloxane units derived from siloxane diols of formula (14), (17), or (18), and polyester units wherein T is a $C_{6-30}$ arylene group. In an embodiment, T is derived from isophthalic and/or terephthalic acid, or reactive chemical equivalents thereof. In another embodiment, $R^1$ is derived from the carbonate reaction product of a resorcinol of formula (9), or a combination of a resorcinol of formula (9) and a bisphenol of formula (4).

The relative amount of each type of unit in the foregoing terpolymer will depend on the desired properties of the terpolymer, and are readily determined by one of ordinary skill in the art without undue experimentation, using the guidelines provided herein. For example, the polycarbonate-polyester-polysiloxane terpolymer can comprise siloxane units in an amount of 0.1 to 25 weight percent (wt. %), specifically 0.2 to 10 wt. %, more specifically 0.2 to 6 wt. %, even more specifically 0.2 to 5 wt. %, and still more specifically 0.25 to 2 wt. %, based on the total weight of the polycarbonate-polyester-polysiloxane terpolymer, with the proviso that the siloxane units are provided by polysiloxane units covalently bonded in the polymer backbone of the polycarbonate-polyester-polysiloxane terpolymer. The polycarbonate-polyester-polysiloxane terpolymer can further comprise 0.1 to 49.85 wt. % carbonate units, 50 to 99.7 wt. % ester units, and 0.2 to 6 wt. % polysiloxane units, based on the total weight of the polysiloxane units, ester units, and carbonate units. Alternatively, the polycarbonate-polyester-polysiloxane terpolymer comprises 0.25 to 2 wt. % polysiloxane units, 60 to 96.75 wt. % ester units, and 3.25 to 39.75 wt. % carbonate units, based on the total weight of the polysiloxane units, ester units, and carbonate units.

In one embodiment, the first polycarbonate is selected from greater than or equal to one of the following: a homopolycarbonate derived from a bisphenol; a copolycarbonate derived from more than one bisphenol; and a copolymer derived from one or more bisphenols and having one or more aliphatic ester units or aromatic ester units or siloxane units.

The first polycarbonate comprises structural units derived from a branching agent. Branched polycarbonate blocks can be prepared by adding a branching agent during polymerization. These branching agents include polyfunctional organic compounds containing greater than or equal to three functional groups selected from hydroxyl, carboxyl, carboxylic anhydride, haloformyl, and mixtures of the foregoing functional groups. Specific examples include trimellitic acid, trimellitic anhydride, trimellitic trichloride (TMTC), tris-p-hydroxy phenyl ethane (THPE), 3,3-bis-(4-hydroxyphenyl)-oxindole (also known as isatin-bis-phenol), tris-phenol TC (1,3,5-tris((p-hydroxyphenyl)isopropyl)benzene), tris-phenol PA (4(4(1,1-bis(p-hydroxyphenyl)-ethyl) alpha, alpha-dimethyl benzyl)phenol), 4-chloroformyl phthalic anhydride, trimesic acid, and benzophenone tetracarboxylic acid. The branching agents can be added at a level of 0.05 to 2.0 wt. %. Mixtures comprising linear polycarbonates and branched polycarbonates can be used.

In some embodiments, a particular type of branching agent is used to create branched polycarbonate materials. These branched polycarbonate materials have statistically more than two end groups. The branching agent is added in an amount (relative to the bisphenol monomer) that is sufficient to achieve the desired branching content, that is, more than two end groups. The molecular weight of the polymer may become very high upon addition of the branching agent and may lead to viscosity problems during phosgenation. Therefore, in some embodiments, an increase in the amount of the end-capping agent is used in the polymerization. The amount of end-capping agent used when the particular branching agent is used is generally higher than if only a end-capping agent alone is used. The amount of end-capping agent used is generally above 5 mole percent and less than 20 mole percent compared to the bisphenol monomer.

In some embodiments, the branching agent is a structure derived from a triacid trichloride of the formula (20):

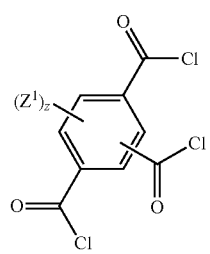
(20)

wherein $Z^1$ is hydrogen, a halogen, $C_{1-3}$ alkyl group, $C_{1-3}$ alkoxy group, $C_{7-12}$ arylalkyl, alkylaryl, or nitro group, and z is 0 to 3; or a branching agent derived from a reaction with a tri-substituted phenol of the formula (21):

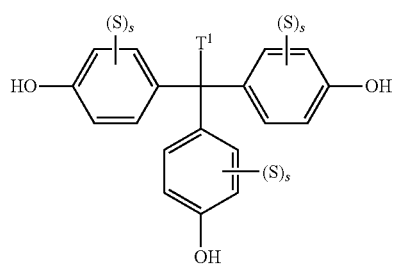
(21)

wherein $T^1$ is a $C_{1-20}$ alkyl group, $C_{1-20}$ alkyleneoxy group, $C_{7-12}$ arylalkyl, or alkylaryl group, S is hydrogen, a halogen, $C_{1-3}$ alkyl group, $C_{1-3}$ alkoxy group, $C_{7-12}$ arylalkyl, alkylaryl, or nitro group, s is 0 to 4.

In another embodiment, the branching agent is a structure having formula (22):

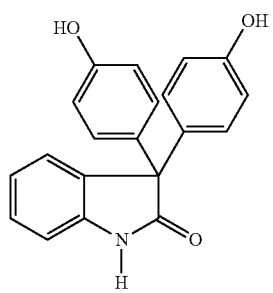
(22)

Examples of specific branching agents that are particularly effective in the compositions include trimellitic trichloride (TMTC), tris-p-hydroxy phenyl ethane (THPE) and isatin-bis-phenol. In one embodiment, in formula (20), Z is hydrogen and z is 3. In another embodiment, in formula (21), S is hydrogen, $T^1$ is methyl and s is 4.

The relative amount of branching agents used in the manufacture of the polymer will depend on a number of considerations, for example the type of $R^1$ groups, the amount of end capping agent, and the desired molecular weight of the polycarbonate. In general, the amount of branching agent is effective to provide 0.1 to 10 branching units per 100 $R^1$ units, specifically 0.5 to 8 branching units per 100 $R^1$ units, and more specifically 0.75 to 5 branching units per 100 $R^1$ units. For branching agents having formula (20), the amount of branching tri-ester units are present in an amount of 0.1 to 10 branching units per 100 $R^1$ units, specifically 0.5 to 8 branching units per 100 $R^1$ units, and more specifically 0.75 to 5 tri-ester units per 100 $R^1$ units. For branching agents having formula (21), the amount of branching tricarbonate units are present in an amount of 0.1 to 10 branching units per 100 $R^1$ units, specifically 0.5 to 8 branching units per 100 $R^1$ units, and more specifically 0.75 to 5 tricarbonate units per 100 $R^1$ units. In some embodiments, a combination of two or more branching agents may be used.

In one embodiment, the first polycarbonate has a branching level greater than or equal to 2% or greater than or equal to 3%.

Various types of end-capping agents can be utilized. In one embodiment, the end-capping agent is selected based upon the molecular weight of the polycarbonate and the branching level imparted by the branching agent. The desired goal is achieve a thin walled article with good flame retardance, e.g. a composition wherein a molded article of the composition has a UL94 V0 rating at a thickness less than or equal to 1.5 millimters (mm), or, more specifically, 1.2 mm, or more specifically 1.0 mm.

Without being bound by theory, the pKa of the end-capping agent can be of importance in achieving a thin-walled article of manufacture with a UL94 V0 rating. The pKa of an end-capping agent is a measure of its relative acidity. The lower the pKa value of the end-capping agent the more acidic the end-capping agent. It was unexpectedly observed that the pKa of an end-capping agent is one indicator of the flame retardancy of the branched polycarbonate. For example lower pKas provide better flame retardant properties than higher pKas for branched polycarbonates.

In one embodiment, the end-capping agent has a pKa of 8.3 to 11. In another embodiment, the end-capping agent has a pKa of 8.3 to 10. In a further embodiment, the end-capping agent has a pKa of 9 to 11.

In another embodiment, the end-capping agents are selected from greater than or equal to one of the following: phenol or a phenol containing one or more substitutions with greater than or equal to one of the following: aliphatic groups, olefinic groups, aromatic groups, halogens, ester groups, cyano groups, and ether groups.

Of particular usefulness commercially, in another embodiment, the end-capping agents are selected from greater than or equal to one of the following: phenol, para-t-butylphenol or para-cumylphenol.

A certain type of end-group, e.g. p-cyanophenol, attached to the ends of branched polycarbonate chains can also provide anti-dripping benefits during UL testing. Not all branched polycarbonates are formed from p-cyanophenol end-capping agents however.

A general way has been discovered to design polycarbonates by balancing molecular weight, branching level and end-group type to produce transparent polycarbonate formulations that are easily molded into thin wall articles and have excellent UL94 properties. This involves measuring the peak melt viscosity of the polycarbonate between 350° C. and 450° C. during a melt rheology test. The "peak melt viscosity" is the highest melt viscosity value (in poise) achieved between 350° C. and 450° C. during rheological testing of a polycarbonate resin.

In some embodiments the first polycarbonate has a peak melt viscosity at or above 25,000 poise between 350° C. and 450° C. In some embodiments the first polycarbonate has a peak melt viscosity of 7,000 poise between 350° C. and 450° C.

Furthermore after measuring the peak melt viscosity of many polycarbonate resins having different levels of branching, MW (weight average molecular weight of the polycarbonate containing said end-capping agent and said branching agent) and different types of end-capping agents a relationship has been discovered between the branching level, BL (moles branching agent/moles bisphenol(s)), MW (by GPC using polycarbonate standards) and pKa of the end-capping agent. This relationship is expressed in the following polynomial equation:

Peak Melt Viscosity=−57135.91+36961.39*BL+
14001.13*MW$^{1/3}$−46944.24*pKa−
322.51*BL*MW$^{1/3}$−2669.19*BL*pKa+
215.83*MW$^{1/3}$*pKa+
1125.63*BL$^2$*200.11*MW$^{2/3}$+2231.15*pKa$^2$ wherein BL is the mole ratio of branching agent in the formulation determined by dividing the number of moles of branching agent by the total number of moles of bisphenol or bisphenols in the composition, the MW is the weight-averaged molecular weight of the polycarbonate containing said branching agent and said end-capping agent as determined by gel permeation chromatography using polycarbonate standards, and the pKa is the pKa of the end-capping agent.

The equation above allows the design of a wide range of first polycarbonate resins that will have excellent UL94 V0 properties at thin wall thicknesses. Designing the polycarbonate resins involves selecting an end-capping agent and adjusting the MW of the resin and the branching level of the resin in the manufacturing process so that the calculated or measured peak melt viscosity, e.g. has a high value 7000 poise or greater for 1.5 mm or greater and 25,000 poise or greater for 1.0 mm or greater. If the pKa of the end-capping agent has a low value (for example methyl-p-hydroxy benzoate with a pKA of 8.) the MW and the amount branching level needed to achieve a UL94 V0 performance can be lower. If the pKa of the end-capping agent is higher (for example p-t-butylphenol with a pKa of 10.3) then the MW and the branching level will need to be higher. Furthermore after the end-capping agent is selected, a choice can be made between balancing the molecular weight with the level of branching agent in the manufacturing process. The balance between the factors can be done without undue experimentation.

Without being bound by theory the viscosity behavior of the first polycarbonate as it passes through the temperature range between 350° C. and 450° C. reflects the beginning of the building up of a polymeric network that impacts the dripping behavior of the resin during UL94 flame testing. Polycarbonate resins that build this network to a higher degree (reflected in a higher peak melt viscosity value in the rheological test) seem to perform better in the UL flame testing at thin walls. The higher the value of the peak melt viscosity the thinner the wall thickness can be for a UL94 V0 pass.

The molecular weight of the first polycarbonate may vary depending on various end uses or other performance properties. The molecular weight of the first polycarbonate can have a value of 20,000 g/mol to 55,000 g/mol, or, more specifically, 20,000 g/mol to 40,000 g/mol as measured by gel permeation chromatography using polycarbonate standards.

The first polycarbonate can be present in an amount of 15 to 50 weight percent, based on the combined weight of the first, second and third polycarbonates. Within this range the amount of the first polycarbonate can be greater than or equal to 20 weight percent, or greater than or equal to 25 weight percent. Also within this range the amount of the first polycarbonate can be less than or equal to 45 weight percent, or less than or equal to 40 weight percent.

B. Second Polycarbonate

The second polycarbonate comprises structural units derived from HO-A$^1$-Y$^1$-A$^2$-OH and structural units derived from HO-A$^1$-Y$^2$-A$^2$-OH wherein each of A$^1$ and A$^2$ is a monocyclic divalent aryl group as described above with regard to the first polycarbonate, Y$^1$ is an aliphatic bridging group or bridging group comprising one to three atoms with the proviso that greater than or equal to one of the atoms is a hetero atom, and Y$^2$ is an aromatic group having 6 to 30 carbon atoms. The second polycarbonate has a glass transition temperature (Tg) greater than or equal to 170° C. as measured using a differential scanning calorimetry method. The Tg can be greater than or equal to 175° C., or, greater than or equal to 180° C., or, greater than or equal to 185° C. The Tg can be less than or equal to 250° C.

Specific examples of bisphenol compounds that can be represented by the formula HO-A$^1$-Y$^1$-A$^2$-OH include 1,1-bis(4-hydroxyphenyl) methane, 1,1-bis(4-hydroxyphenyl) ethane, 2,2-bis(4-hydroxyphenyl) propane (hereinafter "bisphenol A" or "BPA"), 2,2-bis(4-hydroxyphenyl) butane, 2,2-bis(4-hydroxyphenyl) octane, 1,1-bis(4-hydroxyphenyl) propane, 1,1-bis(4-hydroxyphenyl) n-butane, 2,2-bis(4-hydroxy-1-methylphenyl) propane, 1,1-bis(4-hydroxy-t-butylphenyl) propane, and 1,1-bis(4-hydroxy-3-methylphenyl) cyclohexane (DMBPC). Combinations comprising greater than or equal to one of the foregoing dihydroxy compounds can also be used.

Non-limiting examples of dihydroxy compounds of formula HO-A$^1$-Y$^2$-A$^2$-OH include 3,3-bis(4-hydroxyphenyl)-2-phenylisoindolin-1-one (PPPBP), 4,4'-(1-phenylethane-1, 1-diyl)diphenol (Bisphenol AP) as well as adamantyl containing aromatic dihydroxy compounds and fluorene containing aromatic dihydroxy compounds.

The dihydroxy compounds of the formula HO-A$^1$-Y$^2$-A$^2$-OH can have the following formula (11):

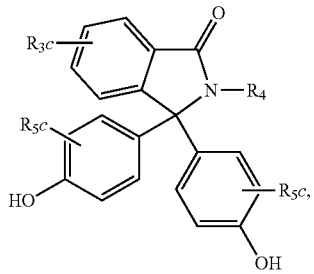

(11)

wherein R$_3$ and R$_5$ are each independently a halogen or a C$_{1-6}$ alkyl group, R$_4$ is a C$_{1-6}$ alkyl, phenyl, or phenyl substituted with up to five halogens or C$_{1-6}$ alkyl groups, and c is 0 to 4. In a specific embodiment, R$_4$ is a C$_{1-6}$ alkyl or phenyl group. In still another embodiment, R$_4$ is a methyl or phenyl group. In another specific embodiment, each c is 0.

A specific example of dihydroxy compounds of formula HO-A$^1$-Y$^2$-A$^2$-OH can be the following formula (6):

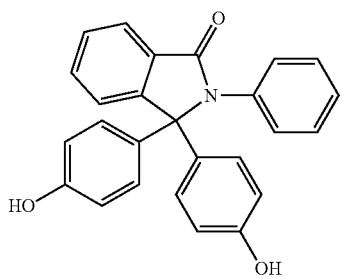

(6)

(also known as 3,3-bis(4-hydroxyphenyl)-2-phenylisoindolin-1-one (PPPBP)) also known as 2-phenyl-3,3-bis(4-hydroxyphenyl)phthalimidine.

Alternatively, the dihydroxy compounds of the formula HO-A$^1$-Y$^2$-A$^2$-OH can have the following formula (7):

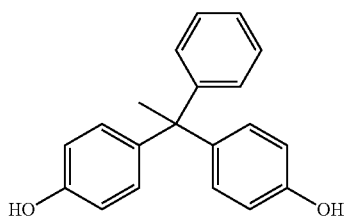

(7)

(also known as 4,4'-(1-phenylethane-1,1-diyl)diphenol (bisphenol AP) also known as 1,1-bis(4-hydroxyphenyl)-1-phenyl-ethane).

Dihydroxy compounds that can be used in combination with monomers that form polycarbonates with Tgs greater than 170° C. include aromatic dihydroxy compounds of formula (10):

(10)

wherein each R$^h$ is independently a halogen atom, a C$_{1-10}$ hydrocarbyl such as a C$_{1-10}$ alkyl group, a halogen substituted C$_{1-10}$ hydrocarbyl such as a halogen-substituted C$_{1-10}$ alkyl group, and n is 0 to 4. The halogen is usually bromine.

In some embodiments the second polycarbonate comprises structural units derived from bisphenol A and PPPBP. The structural units derived from PPPBP can be present in an amount of 20 to 40 mol % based on the total moles of structural units with the balance being derived from bisphenol A.

The second polycarbonate can be present in an amount of 20 to 50 weight percent based on the combined weight of the first, second and third polycarbonates. Within this range the second polycarbonate can be present in an amount greater than or equal to 25 weight percent or greater than or equal to 30 weight percent. Also within this range the second polycarbonate can be present in an amount less than or equal to 45 weight percent, or less than or equal to 40 weight percent.

C. Third Polycarbonate

The third polycarbonate comprises structural units of formula (1) as discussed above wherein at least a portion of R$^1$ is derived from bisphenol A. In fact, the third polycarbonate is similar to the first polycarbonate except that little or no branching agent is employed during synthesis. Accordingly, the description of the first polycarbonate presented above applies also to the third polycarbonate with the exception of branching level, melt viscosity, and molecular weight. The third polycarbonate has a branching level of 0 to less than 2%. The molecular weight can be 17,000 to 40,000 as measured by gel permeation chromatography using polycarbonate standards.

The third polycarbonate can be present in an amount of 15 to 50 weight percent based on the combined weight of the first, second and third polycarbonates. Within this range the third polycarbonate can be present in an amount greater than or equal to 20 weight percent or greater than or equal to 25 weigh percent. Also within this range the second polycarbonate can be present in an amount less than or equal to 40 weight percent, or less than or equal to 35 weight percent.

D. Flame Retardant

Exemplary flame retardants comprising a sulfonate salt include potassium perfluorobutane sulfonate (Rimar salt), potassium perfluoroctane sulfonate, tetraethylammonium perfluorohexane sulfonate, potassium diphenylsulfone sulfonate (KSS), and the like.

The foregoing flame retardant additives are present in amounts of 0.01 to 1 wt. %, more specifically 0.02 to 0.9 wt. %, based on the combined weight of the first, second and third polycarbonates.

E. Additives

The thermoplastic composition can include various additives ordinarily incorporated in polycarbonate compositions of this type, with the proviso that the additives are selected so as to not significantly adversely affect the desired properties of the polycarbonate, for example, transparency and flame retardance. Combinations of additives can be used. Such additives can be mixed at a suitable time during the mixing of the components for forming the composition.

Various additives can be incorporated into the composition of matters encompassed by this disclosure/claimed invention.

In one embodiment, one or more additives are selected from greater than or equal to one of the following: impact modifier, UV stabilizing additives, thermal stabilizing additives, mold release agents, colorants, organic and inorganic fillers, and gamma-stabilizing agents.

Possible fillers or reinforcing agents include, for example, silicates and silica powders such as aluminum silicate (mullite), synthetic calcium silicate, zirconium silicate, fused silica, crystalline silica graphite, natural silica sand, or the like; boron powders such as boron-nitride powder, boron-silicate powders, or the like; oxides such as $TiO_2$, aluminum oxide, magnesium oxide, or the like; calcium sulfate (as its anhydride, dihydrate or trihydrate); calcium carbonates such as chalk, limestone, marble, synthetic precipitated calcium carbonates, or the like; talc, including fibrous, modular, needle shaped, lamellar talc, or the like; wollastonite; surface-treated wollastonite; glass spheres such as hollow and solid glass spheres, silicate spheres, cenospheres, aluminosilicate (armospheres), or the like; kaolin, including hard kaolin, soft kaolin, calcined kaolin, kaolin comprising various coatings known in the art to facilitate compatibility with the polycarbonate polymeric matrix, or the like; single crystal fibers or "whiskers" such as silicon carbide, alumina, boron carbide, iron, nickel, copper, or the like; fibers (including continuous and chopped fibers) such as asbestos, carbon fibers, glass fibers, such as E, A, C, ECR, R, S, D, or NE glasses, or the like; sulfides such as molybdenum sulfide, zinc sulfide or the like; barium compounds such as barium titanate, barium ferrite, barium sulfate, heavy spar, or the like; metals and metal oxides such as particulate or fibrous aluminum, bronze, zinc, copper and nickel or the like; flaked fillers such as glass flakes, flaked silicon carbide, aluminum diboride, aluminum flakes, steel flakes or the like; fibrous fillers, for example short inorganic fibers such as those derived from blends comprising greater than or equal to one of aluminum silicates, aluminum oxides, magnesium oxides, and calcium sulfate hemihydrate or the like; natural fillers and reinforcements, such as wood flour obtained by pulverizing wood, fibrous products such as cellulose, cotton, sisal, jute, starch, cork flour, lignin, ground nut shells, corn, rice grain husks or the like; organic fillers such as polytetrafluoroethylene; reinforcing organic fibrous fillers formed from organic polymers capable of forming fibers such as poly (ether ketone), polyimide, polybenzoxazole, poly(phenylene sulfide), polyesters, polyethylene, aromatic polyamides, aromatic polyimides, polyetherimides, polytetrafluoroethylene, acrylic resins, poly(vinyl alcohol) or the like; as well as additional fillers and reinforcing agents such as mica, clay, feldspar, flue dust, fillite, quartz, quartzite, perlite, tripoli, diatomaceous earth, carbon black, or the like, or combinations comprising greater than or equal to one of the foregoing fillers or reinforcing agents.

The fillers and reinforcing agents can be coated with a layer of metallic material to facilitate conductivity, or surface treated with silanes to improve adhesion and dispersion with the polycarbonate polymeric matrix. In addition, the reinforcing fillers can be provided in the form of monofilament or multifilament fibers and can be used individually or in combination with other types of fiber, through, for example, co-weaving or core/sheath, side-by-side, orange-type or matrix and fibril constructions, or by other methods known to one skilled in the art of fiber manufacture. Exemplary co-woven structures include, for example, glass fiber-carbon fiber, carbon fiber-aromatic polyimide (aramid) fiber, and aromatic polyimide fiberglass fiber or the like. Fibrous fillers can be supplied in the form of, for example, rovings, woven fibrous reinforcements, such as 0-90 degree fabrics or the like; non-woven fibrous reinforcements such as continuous strand mat, chopped strand mat, tissues, papers and felts or the like; or three-dimensional reinforcements such as braids. Fillers are generally used in amounts of 0 to 80 parts by weight, based on 100 parts by weight of the polymer component of the composition.

Exemplary antioxidant additives include, for example, organophosphites such as tris(nonyl phenyl)phosphite, tris (2,4-di-t-butylphenyl)phosphite ("IRGAFOS 168" or "I-168"), bis(2,4-di-t-butylphenyl)pentaerythritol diphosphite, distearyl pentaerythritol diphosphite or the like; alkylated monophenols or polyphenols; alkylated reaction products of polyphenols with dienes, such as tetrakis[methylene (3,5-di-tert-butyl-4-hydroxyhydrocinnamate)]methane, or the like; butylated reaction products of para-cresol or dicyclopentadiene; alkylated hydroquinones; hydroxylated thiodiphenyl ethers; alkylidene-bisphenols; benzyl compounds; esters of beta-(3,5-di-tert-butyl-4-hydroxyphenyl)-propionic acid with monohydric or polyhydric alcohols; esters of beta-(5-tert-butyl-4-hydroxy-3-methylphenyl)-propionic acid with monohydric or polyhydric alcohols; esters of thioalkyl or thioaryl compounds such as distearylthiopropionate, dilaurylthiopropionate, ditridecylthiodipropionate, octadecyl-3-(3,5-di-tert-butyl-4-hydroxyphenyl)propionate, pentaerythrityl-tetrakis[3-(3,5-di-tert-butyl-4-hydroxyphenyl)propionate or the like; amides of beta-(3,5-di-tert-butyl-4-hydroxyphenyl)-propionic acid or the like, or combinations comprising greater than or equal to one of the foregoing antioxidants. Antioxidants are generally used in amounts of 0.0001 to 1 parts by weight, based on 100 parts by weigh of the polymer component of the thermoplastic composition (excluding any filler).

Exemplary heat stabilizer additives include, for example, organophosphites such as triphenyl phosphite, tris-(2,6-dimethylphenyl)phosphite, tris-(mixed mono- and di-nonylphenyl)phosphite or the like; phosphonates such as dimethylbenzene phosphonate or the like, phosphates such as trimethyl phosphate, or the like, or combinations comprising greater than or equal to one of the foregoing heat stabilizers. Heat stabilizers are generally used in amounts of 0.0001 to 1 parts by weight, based on 100 parts by weight of the polymer component of the thermoplastic composition.

Light stabilizers and/or ultraviolet light (UV) absorbing additives can also be used. Exemplary light stabilizer additives include, for example, benzotriazoles such as 2-(2-hydroxy-5-methylphenyl)benzotriazole, 2-(2-hydroxy-5-tert-octylphenyl)-benzotriazole and 2-hydroxy-4-n-octoxy benzophenone, or the like, or combinations comprising greater than or equal to one of the foregoing light stabilizers. Light stabilizers are generally used in amounts of 0.0001 to 1 parts by weight, based on 100 parts by weight of the polymer component of the thermoplastic composition.

Exemplary UV absorbing additives include for example, hydroxybenzophenones; hydroxybenzotriazoles; hydroxybenzotriazines; cyanoacrylates; oxanilides; benzoxazinones; 2-(2H-benzotriazol-2-yl)-4-(1,1,3,3-tetramethylbutyl)-phenol (CYASORB* 5411); 2-hydroxy-4-n-octyloxybenzophenone (CYASORB* 531); 2-[4,6-bis(2,4-dimethylphenyl)-1, 3,5-triazin-2-yl]-5-(octyloxy)-phenol (CYASORB* 1164); 2,2'-(1,4-phenylene)bis(4H-3,1-benzoxazin-4-one) (CYASORB* UV-3638); 1,3-bis[(2-cyano-3,3-diphenylacryloyl) oxy]-2,2-bis[[(2-cyano-3,3-diphenylacryloyl)oxy]methyl] propane (UVINUL* 3030); 2,2'-(1,4-phenylene)bis(4H-3,1-benzoxazin-4-one); 1,3-bis[(2-cyano-3,3-diphenylacryloyl)

oxy]-2,2-bis[[(2-cyano-3,3-diphenylacryloyl)oxy]methyl] propane; nano-size inorganic materials such as titanium oxide, cerium oxide, and zinc oxide, all with particle size less than or equal to 100 nanometers; or the like, or combinations comprising greater than or equal to one of the foregoing UV absorbers. UV absorbers are generally used in amounts of 0.0001 to 1 parts by weight, based on 100 parts by weight of the polymer component of the thermoplastic composition.

Plasticizers, lubricants, and/or mold release agents can also be used. There is considerable overlap among these types of materials, which include, for example, phthalic acid esters such as dioctyl-4,5-epoxy-hexahydrophthalate; tris-(octoxycarbonylethyl)isocyanurate; tristearin; di- or poly-functional aromatic phosphates such as resorcinol tetraphenyl diphosphate (RDP), the bis(diphenyl)phosphate of hydroquinone and the bis(diphenyl)phosphate of bisphenol A; poly-alpha-olefins; epoxidized soybean oil; silicones, including silicone oils; esters, for example, fatty acid esters such as alkyl stearyl esters, e.g., methyl stearate, stearyl stearate, pentaerythritol tetrastearate (PETS), and the like; combinations of methyl stearate and hydrophilic and hydrophobic nonionic surfactants comprising polyethylene glycol polymers, polypropylene glycol polymers, poly(ethylene glycol-co-propylene glycol) copolymers, or a combination comprising greater than or equal to one of the foregoing glycol polymers, e.g., methyl stearate and polyethylene-polypropylene glycol copolymer in a suitable solvent; waxes such as beeswax, montan wax, paraffin wax, or the like. Such materials are generally used in amounts of 0.001 to 1 parts by weight, specifically 0.01 to 0.75 parts by weight, more specifically 0.1 to 0.5 parts by weight, based on 100 parts by weight of the polymer component of the thermoplastic composition.

The term "antistatic agent" refers to monomeric, oligomeric, or polymeric materials that can be processed into polymer resins and/or sprayed onto materials or articles to improve conductive properties and overall physical performance. Examples of monomeric antistatic agents include glycerol monostearate, glycerol distearate, glycerol tristearate, ethoxylated amines, primary, secondary and tertiary amines, ethoxylated alcohols, alkyl sulfates, alkylarylsulfates, alkylphosphates, alkylaminesulfates, alkyl sulfonate salts such as sodium stearyl sulfonate, sodium dodecylbenzenesulfonate or the like, quaternary ammonium salts, quaternary ammonium resins, imidazoline derivatives, sorbitan esters, ethanolamides, betaines, or the like, or combinations comprising greater than or equal to one of the foregoing monomeric antistatic agents.

Exemplary polymeric antistatic agents include certain polyesteramides polyether-polyamide (polyetheramide) block copolymers, polyetheresteramide block copolymers, polyetheresters, or polyurethanes, each containing polyalkylene glycol moieties polyalkylene oxide units such as polyethylene glycol, polypropylene glycol, polytetramethylene glycol, and the like. Such polymeric antistatic agents are commercially available, for example PELESTAT* 6321 (Sanyo) or PEBAX* MH1657 (Atofina), IRGASTAT* P18 and P22 (Ciba-Geigy). Other polymeric materials that can be used as antistatic agents are inherently conducting polymers such as polyaniline (commercially available as PANIPOL*EB from Panipol), polypyrrole and polythiophene (commercially available from Bayer), which retain some of their intrinsic conductivity after melt processing at elevated temperatures. In one embodiment, carbon fibers, carbon nanofibers, carbon nanotubes, carbon black, or a combination comprising greater than or equal to one of the foregoing can be used in a polymeric resin containing chemical antistatic agents to render the composition electrostatically dissipative. Antistatic agents are generally used in amounts of 0.0001 to 5 parts by weight, based on 100 parts by weight of the polymer component of the thermoplastic composition.

Colorants such as pigment and/or dye additives can also be present provided they do not adversely affect flame retardant performance. Useful pigments can include, for example, inorganic pigments such as metal oxides and mixed metal oxides such as zinc oxide, titanium dioxides, iron oxides, or the like; sulfides such as zinc sulfides, or the like; aluminates; sodium sulfo-silicates sulfates, chromates, or the like; carbon blacks; zinc ferrites; ultramarine blue; organic pigments such as azos, di-azos, quinacridones, perylenes, naphthalene tetracarboxylic acids, flavanthrones, isoindolinones, tetrachloroisoindolinones, anthraquinones, enthrones, dioxazines, phthalocyanines, and azo lakes; Pigment Red 101, Pigment Red 122, Pigment Red 149, Pigment Red 177, Pigment Red 179, Pigment Red 202, Pigment Violet 29, Pigment Blue 15, Pigment Blue 60, Pigment Green 7, Pigment Yellow 119, Pigment Yellow 147, Pigment Yellow 150, and Pigment Brown 24; or combinations comprising greater than or equal to one of the foregoing pigments. Pigments are generally used in amounts of 0.01 to 10 parts by weight, based on 100 parts by weight of the polymer component of the thermoplastic composition.

Exemplary dyes are generally organic materials and include, for example, coumarin dyes such as coumarin 460 (blue), coumarin 6 (green), nile red or the like; lanthanide complexes; hydrocarbon and substituted hydrocarbon dyes; polycyclic aromatic hydrocarbon dyes; scintillation dyes such as oxazole or oxadiazole dyes; aryl- or heteroaryl-substituted poly($C_{2-8}$) olefin dyes; carbocyanine dyes; indanthrone dyes; phthalocyanine dyes; oxazine dyes; carbostyryl dyes; napthalenetetracarboxylic acid dyes; porphyrin dyes; bis(styryl)biphenyl dyes; acridine dyes; anthraquinone dyes; cyanine dyes; methine dyes; arylmethane dyes; azo dyes; indigoid dyes, thioindigoid dyes, diazonium dyes; nitro dyes; quinone imine dyes; aminoketone dyes; tetrazolium dyes; thiazole dyes; perylene dyes, perinone dyes; bis-benzoxazolylthiophene (BBOT); triarylmethane dyes; xanthene dyes; thioxanthene dyes; naphthalimide dyes; lactone dyes; fluorophores such as anti-stokes shift dyes which absorb in the near infrared wavelength and emit in the visible wavelength, or the like; luminescent dyes such as 7-amino-4-methylcoumarin; 3-(2'-benzothiazolyl)-7-diethylaminocoumarin; 2-(4-biphenylyl)-5-(4-t-butylphenyl)-1, 3,4-oxadiazole; 2,5-bis-(4-biphenylyl)-oxazole; 2,2'-dimethyl-p-quaterphenyl; 2,2-dimethyl-p-terphenyl; 3,5,3"", 5""-tetra-t-butyl-p-quinquephenyl; 2,5-diphenylfuran; 2,5-diphenyloxazole; 4,4'-diphenylstilbene; 4-dicyanomethylene-2-methyl-6-(p-dimethylaminostyryl)-4H-pyran; 1,1'-diethyl-2,2'-carbocyanine iodide; 3,3'-diethyl-4,4',5,5'-dibenzothiatricarbocyanine iodide; 7-dimethylamino-1-methyl-4-methoxy-8-azaquinolone-2; 7-dimethylamino-4-methylquinolone-2; 2-(4-(4-dimethylaminophenyl)-1,3-butadienyl)-3-ethylbenzothiazolium perchlorate; 3-diethylamino-7-diethyliminophenoxazonium perchlorate; 2-(1-naphthyl)-5-phenyloxazole; 2,2'-p-phenylen-bis(5-phenyloxazole); rhodamine 700; rhodamine 800; pyrene, chrysene, rubrene, coronene, or the like; or combinations comprising greater than or equal to one of the foregoing dyes. Dyes are generally used in amounts of 0.01 to 10 parts by weight, based on 100 parts by weight of the polymer component of the thermoplastic composition.

Radiation stabilizers can also be present, specifically gamma-radiation stabilizers. Exemplary gamma-radiation stabilizers include alkylene polyols such as ethylene glycol, propylene glycol, 1,3-propanediol, 1,2-butanediol, 1,4-butanediol, meso-2,3-butanediol, 1,2-pentanediol, 2,3-pentanediol, 1,4-pentanediol, 1,4-hexandiol, and the like; cycloalkylene polyols such as 1,2-cyclopentanediol, 1,2-cyclohexanediol, and the like; branched alkylenepolyols such as 2,3-dimethyl-2,3-butanediol (pinacol), and the like, as well as alkoxy-substituted cyclic or acyclic alkanes. Unsaturated alkenols are also useful, examples of which include 4-methyl-4-penten-2-ol, 3-methyl-pentene-3-ol, 2-methyl-4-penten-2-ol, 2,4-dimethyl-4-pene-2-ol, and 9 to decen-1-ol, as well as tertiary alcohols that have greater than or equal to one hydroxy substituted tertiary carbon, for example 2-methyl-2,4-pentanediol (hexylene glycol), 2-phenyl-2-butanol, 3-hydroxy-3-methyl-2-butanone, 2-phenyl-2-butanol, and the like, and cyclic tertiary alcohols such as 1-hydroxy-1-methyl-cyclohexane. Certain hydroxymethyl aromatic compounds that have hydroxy substitution on a saturated carbon attached to an unsaturated carbon in an aromatic ring can also be used. The hydroxy-substituted saturated carbon can be a methylol group (—CH$_2$OH) or it can be a member of a more complex hydrocarbon group such as —CR$_4$HOH or —CR$_{24}$OH wherein R$^4$ is a complex or a simple hydrocarbon. Specific hydroxy methyl aromatic compounds include benzhydrol, 1,3-benzenedimethanol, benzyl alcohol, 4-benzyloxy benzyl alcohol and benzyl benzyl alcohol. 2-Methyl-2,4-pentanediol, polyethylene glycol, and polypropylene glycol are often used for gamma-radiation stabilization. Gamma-radiation stabilizing compounds are typically used in amounts of 0.1 to 10 parts by weight based on 100 parts by weight of the polymer component of the thermoplastic composition.

The thermoplastic compositions can be manufactured by various methods. For example, some or all of the components can be first blended in a HENSCHEL-Mixer* high speed mixer. Other low shear processes, including but not limited to hand mixing, can also accomplish this blending. The blend is then fed into the throat of a single or twin-screw extruder via a hopper. Alternatively, greater than or equal to one of the components can be incorporated into the composition by feeding directly into the extruder at the throat and/or downstream through a sidestuffer. Additives can also be compounded into a master batch with a desired polymeric resin and fed into the extruder. The extruder is generally operated at a temperature higher than that necessary to cause the composition to flow. The extrudate is immediately quenched in a water batch and pelletized. The pellets, so prepared, when cutting the extrudate can be one-fourth inch long or less as desired. Such pellets can be used for subsequent molding, shaping, or forming.

In some embodiments described above, the onset of high-temperature cross-linking can be controlled by adjusting the molecular weight of the end-capped polycarbonate or by the addition of certain flame retardant salts; in particular alkali metal salts of perfluorinated C$_{1-16}$ alkyl sulfonates. In one embodiment, the addition of an inorganic flame retardant (e.g., KSS) increases the temperature of the onset of cross-linking/branching in the polycarbonate by 20 to 80° C., specifically 40 to 60° C.

Shaped, formed, or molded articles comprising the thermoplastic compositions are also provided. The thermoplastic compositions can be molded into useful shaped articles by a variety of means such as injection molding, extrusion, rotational molding, blow molding and thermoforming to form articles such as, for example, computer and business machine housings such as housings for monitors, handheld electronic device housings such as housings for cell phones, electrical connectors, and components of lighting fixtures, ornaments, home appliances, roofs, greenhouses, sun rooms, swimming pool enclosures, and the like. The compositions are of particular utility in the manufacture of thin walled articles such as housings for electronic devices. Additional examples of articles that can be formed from the compositions include electrical parts, such as relays, and enclosures, consumer electronics such as enclosures and parts for laptops, desktops, docking stations, PDAs, digital cameras, desktops, and telecommunications parts such as parts for base station terminals.

E. Polycarbonate Synthesis Processes

Polycarbonates can be manufactured by processes such as interfacial polymerization or melt polymerization. Although the reaction conditions for interfacial polymerization can vary, an exemplary process generally involves dissolving or dispersing a dihydric phenol reactant in aqueous caustic soda or potash, adding the resulting mixture to a water-immiscible solvent medium, and contacting the reactants with a carbonate precursor in the presence of a catalyst such as, for example, triethylamine or a phase transfer catalyst, under controlled pH conditions, e.g., 8 to 11. The most commonly used water immiscible solvents include methylene chloride, 1,2-dichloroethane, chlorobenzene, toluene, and the like.

Exemplary carbonate precursors include, for example, a carbonyl halide such as carbonyl bromide or carbonyl chloride, or a haloformate such as a bishaloformates of a dihydric phenol (e.g., the bischloroformates of bisphenol A, hydroquinone, or the like) or a glycol (e.g., the bishaloformate of ethylene glycol, neopentyl glycol, polyethylene glycol, or the like). Combinations comprising greater than or equal to one of the foregoing types of carbonate precursors can also be used. In an exemplary embodiment, an interfacial polymerization reaction to form carbonate linkages uses phosgene as a carbonate precursor, and is referred to as a phosgenation reaction.

Among the phase transfer catalysts that can be used are catalysts of the formula (R$^5$)$_4$Q+X$^2$, wherein R$^5$ is each independently a C$_{1-10}$ alkyl group; Q is a nitrogen or phosphorus atom; and X$^2$ is a halogen atom or a C$_{1-10}$ alkoxy group or C$_{6-18}$ aryloxy group. Exemplary phase transfer catalysts include, for example, [CH$_3$(CH$_2$)$_3$]$_4$NX$^2$, [CH$_3$(CH$_2$)$_3$]$_4$PX$^2$, [CH$_3$(CH$_2$)$_5$]$_4$NX$^2$, [CH$_3$(CH$_2$)$_6$]$_4$NX$^2$, [CH$_3$(CH$_2$)$_4$]$_4$NX$^2$, CH$_3$[CH$_3$(CH$_2$)$_3$]$_3$NX$^2$, and CH$_3$[CH$_3$(CH$_2$)$_2$]$_3$NX$^2$, wherein X$^2$ is a halogen, a C$_{1-8}$ alkoxy group or a C$_{6-18}$ aryloxy group. In an embodiment X$^2$ is Cl or Br. In effective amount of a phase transfer catalyst can be 0.1 to 10 wt. % based on the weight of bisphenol in the phosgenation mixture. In another embodiment an effective amount of phase transfer catalyst can be 0.5 to 2 wt. % based on the weight of bisphenol in the phosgenation mixture.

Alternatively, melt processes can be used to make polycarbonates. Generally, in the melt polymerization process, polycarbonates can be prepared by co-reacting, in a molten state, the dihydroxy reactant(s) and a diaryl carbonate ester, such as diphenyl carbonate, in the presence of a transesterification catalyst in a Banbury* mixer, twin screw extruder, or the like to form a uniform dispersion. Volatile monohydric phenol is removed from the molten reactants by distillation and the polymer is isolated as a molten residue. A specifically useful melt process for making polycarbonates uses a diaryl carbonate ester having electron-withdrawing substituents on the aryls. Examples of specifically useful diaryl carbonate esters with electron withdrawing substituents include bis(4-nitrophenyl)carbonate, bis(2-chlorophenyl)carbonate, bis(4-chlorophenyl)carbonate, bis(methyl salicyl)carbonate, bis(4-methylcarboxylphenyl) carbonate, bis(2-acetylphenyl) carboxylate, bis(4-acetylphenyl) carboxylate, or a combination comprising greater than or equal to one of the foregoing.

Exemplary transesterification catalysts for making polycarbonate using a melt process include acetates, carbonates, borates, borohydrides, oxides, hydroxides, hydrides, and alcoholates of various metals including alkali metals such as lithium, sodium, and potassium, alkali earth metals such as magnesium, calcium and barium and other metals such as zinc, cadmium, tin, antimony, lead, manganese cobalt, or nickel. In addition, other useful transesterification catalysts include basic salts of nitrogen or phosphorus such as tetrabutylammonium hydroxide, methyltributylammonium hydroxide, tetrabutylammonium acetate, tetrabutylphosphonium hydroxide, tetrabutylphosphonium acetate, tetrabutylphosphonium phenolate. Combinations of greater than or equal to one of the foregoing are also useful.

F. Performance Properties

Achieving excellent flame performance, (UL94 V0) for thin wall articles (e.g. 2 mm and thinner) made from polycarbonate resins requires achieving short flame out times while preventing flaming drips during UL94 testing. Short flame out times are usually achieved through the use of flame retardant agents while flaming drips are prevented by adding ant-drip agents such as polytetrafluoroethylene (PTFE). In addition, achieving excellent flame performance for transparent thin wall articles is particularly challenging because anti-drip agents such as PTFE render the article translucent or opaque. Therefore preventing dripping has to be achieved by other means for transparent thin wall articles.

One way to reduce dripping is to increase the molecular weight of the polycarbonate resin but this approach reduces the flow of the resin during molding and so thin wall molds having long flow lengths or intricate designs are difficult to fill without increasing the molding temperature and risking polycarbonate molecular weight degradation and color formation. Branched polycarbonate resins can provide a partial solution to the flow problem because branching provides a means for the polycarbonate chains to entangle, thus reducing dripping without losing as much flow during molding. However branched polycarbonates with higher levels of branching (1% branching or above) can be difficult to make because when the branching is too high the polycarbonates form gels in the manufacturing process and sometimes during molding. Gels hurt the impact properties and the aesthetics of transparent polycarbonate articles and so highly branched polycarbonates are generally avoided in polycarbonate manufacture and in product formulations.

A certain type of end-group, e.g. p-cyanophenol, attached to the ends of branched polycarbonate chains can also provide anti-dripping benefits during UL testing. Not all branched polycarbonates are formed from p-cyanophenol end-capping agents however.

Previously, a UL94 V0 rating at low thicknesses was achieved by combining the first polycarbonate and a sulfonate salt. Similarly the first polycarbonate, sulfonate salt and a linear polycarbonate were combined for a material with excellent flame retardant properties. However, the material had less than desirable heat resistance. The first, second, and third polycarbonates have been combined with the sulfonate salt to make a composition having a desirable combination of properties, namely a UL94 V0 rating at 1.5, 1.2, or 1.0 millimeter thicknesses (or a combination of thicknesses), an HDT greater than or equal to 145° C., ductility greater than or equal to 90% at 23° C., and a multi axial impact greater than or equal to 50 Joules/meter at 23° C. It is also contemplate that the composition can have a UL94 V0 rating at a thickness less than 1.0 millimeter.

Melt volume flow rate (often abbreviated "MVR") measures the rate of extrusion of a thermoplastic through an orifice at a prescribed temperature and load. The composition can have an MVR, measured at 330° C. under a load of 2.16 kg, of 10 to 200 cubic centimeters per 10 minutes ($cm^3/10$ min), specifically 10 to 100 $cm^3/10$ min. MVR is measured by ASTM D 1238. In one embodiment, the composition has an MVR of greater than or equal to 15 $cm^3/10$ min. In a further embodiment, the composition has an MVR of 15 to 60 or 15 to 50 $cm^3/10$ min.

The thermoplastic compositions disclosed herein can have various haze levels. In one embodiment, the composition has a haze value of less than 3% at 3.2 mm thickness as determined by ASTM D1003, or, less than or equal to 2%, or, less than or equal to 1.5%. The composition can also have a light transmission value greater than or equal to 85%, also determined by ASTM D1003.

Conversion Materials

Various types of conversion material(s) can be utilized in conjunction with a plastic (e.g., polycarbonate) containing composition described in this disclosure. Conversion material(s) are selected and added in an effective quantity so as to facilitate luminescence or transmission of an LED or other light-emitting device. The useful conversion material(s) have a short-lived luminescence lifetime of less than $10^{-4}$ seconds(s). It is noted that, depending upon how a conversion material is made, it may be long-lived (luminescence lifetime of greater than minutes) or short-lived.

The conversion material(s) can be coated (e.g., result of applying a material to the surface of the conversion material(s), wherein the coating is on the surface and/or chemically interacts with the surface). Radiometric values (such as radiant power, radiant intensity, irradiance, and radiance) and corresponding photometric values (such as total luminance flux, luminous intensity, illuminance, luminance), luminance efficacy (in lumens per watt (1 m/W)), color rendering index, color quality scale (CQS), correlated color temperature, and chromaticity, are expected to improve compared to the uncoated conversion material(s) when added to a plastic material such as polycarbonate. Desirably, the conversion material(s) can be sufficiently coated so as to maintain melt stability with an MVR change of less than or equal to 30%, specifically less than or equal to 10% (i.e., MVR is determined at 6 minutes and again at 18 minutes, and the difference between these MVRs is less than or equal to 30% of the 6 minute value).

The conversion material(s) can be coated with silicone oil(s) and/or a layer of amorphous silica. Some examples of silicone oils include, but are not limited to: hydrogen-alkyl siloxane oil; polydialkyl siloxance oil; polydimethyl siloxane codiphenyl siloxane, dihydroxy terminated (such as Gelest PDS 1615 commercially available from Gelest, Inc.); as well as combinations comprising at least one of the foregoing. Such silicone oils are considered coatings where the conversion material is first treated with the silicone oil(s) prior to addition to a matrix or binder (collectively referred to as matrix), such as polycarbonate. The coating itself, is neither the binder nor the matrix that contains the conversion material to hold in place for exposure to blue LED radiation. Additionally, the coating does not require a curing method.

The conversion material can be coated with silicone oil e.g., by a method such as spraying the silicon oil. For example, the conversion material can be coated by spraying of the silicone oil in a fluidized bed reactor. The total amount of silicone oil can be 0.05 wt % to 20 wt % with respect to the conversion material, specifically, 0.1 wt % to 10 wt %, and more specifically, 0.5 wt % to 5 wt %, based upon the total weight of the conversion material. When two silicone coatings are used, such as polymethylhydrosiloxane and polydimethylsiloxane, the total amount does not change, and the split ratio between the two oils can be 1:99 to 99:1 depending on the type of protection being sought. In an embodiment, the first coating represents at least about 50 wt % of the total silicone oil content. Coating of conversion materials is further described in commonly assigned U.S. Pat. No. 6,692,659 B2 to Brown et al.

Some examples of oils include polymethylhydrosiloxane (for example, DF1040 commercially available from Momentive Performance Materials) and polydimethyl siloxane (e.g., DF581 commercially available from Momentive Performance Materials). Other examples include diphenyl siloxane, e.g., silanol terminated oils such as silanol terminated diphenylsiloxane (e.g., PDS-1615 commercially available from Gelest, Inc., Morrisville, Pa.). Loading level up to 4 pph by weight, specifically a loading of 0.1 to 0.5 (e.g., 0.2) pph by weight of pigment (e.g., Gelest PDS-1615). Other possible silanol terminated siloxanes include PDS-0338 and PDS-9931 also commercially available from Gelest, Inc. Desirably, the final article comprising the coated conversion material(s) comprises less than or equal to 20 pbw of conversion material(s) to 100 pbw of plastic material.

The conversion material(s), including those of which are surface treated, include: conversion material(s) having formula:

$$(A^3)_2SiO_4:Eu^{2+}D^1$$

where $A^3$ is a divalent metal comprising Sr, Ca, Ba, Mg, Zn, Cd, or a combination thereof, and $D^1$ is a dopant comprising F, Cl, Br, I, P, S, N, or a combination thereof The conversion material(s) can be material(s) having formula: $(A^4)_2SiO_4:Eu^{2+}D^2$ with an optional dopant comprising Al, Co, Fe, Mg, Mo, Na, Ni, Pd, P, Rh, Sb, Ti. Zr, or a combination thereof, wherein $A^4$ comprises Sr, Ba, Ca, or a combination thereof.

The conversion material(s) can be material(s) having formula:

$$(YA^5)_3(AlB)_5(OD^3)_{12}:Ce^{3+} \qquad (25)$$

where $A^5$ is a trivalent metal comprising Gd, Tb, La, Sm, or a combination thereof, or a divalent metal ion such as Sr, Ca, Ba, Mg, Zn, Cd, or a combination thereof; B comprises Si, B, P, Ga, or a combination thereof and $D^3$ is a dopant comprising F, Cl, Br, I, P, S, N, or a combination thereof. Other possible yellow conversion material(s) include: $Y_3Al_5O_{12}:Ce$; $Tb_{3-x}RE_xAl_5O_{12}:Ce$ (TAG), wherein RE=Y, Gd, La, Lu; $Sr_{2-x-y}Ba_xCa_ySiO_4:Eu$; $Sr_{3-x}SiO_5:Eu^{2+}_x$, wherein $0<x\leq 1$. Possible yellow/green conversion material(s) include: $(Sr,Ca,Ba)(Al,Ga)_2S_4:Eu^{2+}$; $Ba_2(Mg,Zn)Si_2O_7:Eu^{2+}$; $Gd_{0.46}Sr_{0.31}Al_{1.23}O_xF_{1.38}:Eu^{2+}_{0.06}$ $(Ba_{1-x-y}Sr_xCa_y)SiO_4:Eu$; and $Ba_2SiO_4:Eu^{2+}$.

The conversion material(s) can be a material having the following formula: $(YGd)_3Al_5O_{12}:Ce^{3+}$ or $Y_3Al_5(OD^3)_{12}:Ce^{3+}$.

The conversion material(s) can be orange-red silicate-based conversion material(s) having formula:

$$(SrM1)_3Si(OD^4)_5:Eu$$

where M1 comprises Ba, Ca, Mg, Zn, or a combination thereof; and $D^4$ comprises F, Cl, S, N, or a combination thereof; a $Eu^{2+}$ doped and or $Dy^{3+}$ conversion material(s) having formula:

$$M_3MgSi_2O_8$$

wherein M comprises Ca, Sr, Ba, or a combination thereof.

The conversion material(s) can be red silicon nitride based $Eu^{2+}$ doped conversion material(s) having a formula:

$$(SrM2)_2Si_5N_8$$

where M2 comprises Ca, Mg, Zn, or a combination thereof. Other nitridosilicates, oxonitridosilicates, oxonitridoaluminosilicates examples include:

$$Ba_2SiN_8:Eu^{2+}$$

alpha-SiAlON:Re (Re=$Eu^{2+}$, $Ce^{3+}$, $Yb^{2+}$, $Tb^{3+}$, $Pr^{3+}$, $Sm^{3+}$), and optionally a combination thereof.

$$Beta-SiAlON:Eu^{2+}$$

$$Sr_2Si_5N_8:Eu^{2+},Ce^{3+}$$

Rare earth doped red sulfate based conversion material(s), e.g., have the formula:

$$(SrM3)S$$

where M3 comprises Ca, Ba, Mg, or a combination thereof. Other possible red conversion material(s) include $Sr_xCa_{1-x}S:Eu,Y$, wherein Y is a halide; $CaSiAlN_3:Eu^{2+}$; $Sr_{2-y}Ca_ySiO_4:Eu$; $Lu_2O_3:Eu^{3+}$; $(Sr_{2-x}La_x)(Ce_{1-x}Eu_x)O_4$; $Sr_2Ce_{1-x}Eu_xO_4$; $Sr_{2-x}Eu_xCeO_4$; $SrTiO_3:Pr^{3+},Ga^{3+}$; $CaAlSiN_3:Eu^{2+}$; and $Sr_2Si_5N_8:Eu^{2+}$.

The conversion material(s) can comprise blue conversion material(s), e.g., having the formula $BaMgAl_{10}O_{17}:Eu^{2+}$.

The conversion material(s) can comprise green sulfate based conversion material(s), e.g., having formula:

$$(SrM3)(GaM4)_2S_4:Eu$$

where M3 is set forth above, and M4 is selected from Al and In.

The conversion material(s) can include $Tb_{3-x}RE^1_xO_{12}:Ce$ (TAG), wherein $RE^1$ is selected from Y, Gd, La, Lu, or a combination thereof; yttrium aluminum garnet (YAG) doped with cerium (e.g., $(Y,Gd)_3Al_5O_{12}:Ce^{3+}$; YAG:Ce); terbium aluminum garnet doped with cerium (TAG:Ce); silicate conversion material(s) (BOSE), (e.g. $(Sr)_2SiO_4:Eu$, $(Ba)_2SiO_4:Eu$, $(Ca)_2SiO_4:Eu$); nitride conversion material(s) (e.g., doped with cerium and/or europium); nitrido silicates (e.g., $LaSi_3N_5:Eu^{2+}$, $O^{2-}$ or $Ba_2Si_5N_8:Eu^{2+}$); nitride orthosilicate (e.g., such as disclosed in DE 10 2006 016 548 A1); or a combination thereof. Other possible green conversion material(s) include: $SrGa2S_4:Eu$, $Sr_{2-y}BaySiO_4:Eu$, $SrSiO_2N_2:Eu$, and $Ca_3Si_2O_4N_2:Eu^{2+}$.

The various conversion material(s) (e.g., coated conversion material(s)) described above can be used alone or in combination. The conversion material(s) can comprise combinations of yellow conversion material(s) (such as $(Y,Gd)_3Al_5O_{12}:Ce3+$ or $(Sr,Ba,Ca)_2SiO_4:Eu$) with a red conversion material(s) (such as $(Sr,Ca)AlSiN_3:Eu$), e.g., to produce a warm white light. The conversion material(s) comprise combinations of green aluminate (GAL) and a red conversion material(s) (e.g., to produce white light from the RGB of blue LED, green light and red light). Green aluminate and red nitride conversion material(s) can be used alone or combined to generate white light when exposed to blue LED light. Red nitride conversion material(s) may contain ions to promote quantum efficiency. The conversion material(s) can comprise a combination of a semiconductor nanocrystals of cadmium sulfide mixed with manganese; and/or a $La_3Si_6N_{11}:Ce^{3+}$. A YAG:Ce conversion material or BOSE (boron ortho-silicate) conversion material, for example, can be utilized to convert the blue light to yellow. A reddish AlInGaP LED can be included to pull yellow light from the conversion material to the black body curve.

Also included are combinations comprising at least one of the foregoing conversion materials.

The YAG:Ce based conversion material(s) can be synthetic aluminum garnets, with garnet structure $A_3^{3+}B_5^{3+}O_{12}^{2-}$ (containing $Al_5O_{12}^{9-}$ and A is a trivalent element such as $Y^{3+}$). Specifically, in some embodiments, the conversion material(s) is not an aluminum spinel, wherein a spinel has the structure $A^{2+}B_2^{3+}O_4^{2-}$ ($Al_2O_4^{2-}$ and A is a divalent alkaline earth element such as $Ca^{2+}$, $Sr^{2+}$, and $Ba^{2+}$). The aluminum garnet is synthetically prepared in such a manner (annealing) as to impart short-lived luminescence lifetime lasting less than $10^{-4}$ s. Another process for forming short-lived luminescence (i.e., avoiding forming long afterglow materials) is disclosed in Advanced Powder Technology to Shii Chou et al., Volume 23, Issue 1, January 2012, Pages 97-103.

The amount of conversion material(s) added to a plastic material to form the plastic composition may vary according to the selected plastic composition and/or the surface coating for the selected conversion material(s). The conversion material(s) can be added to the plastic material in an amount of 0.1 to 40 parts by weight (pbw) of conversion material based on 100 pbw of plastic material, specifically, 4 to 20 pbw of conversion material(s) to 100 pbw of plastic material.

The conversion material(s) can have a median particle size of 10 nanometers (nm) to 100 micrometers (μm), as determined by laser diffraction. The median particle size is sometimes indicated as $D_{50}$-value. The median particle size can be 1 to 30 micrometers, specifically, 5 to 25 micrometers. Examples of median particle sizes include 1 to 5 micrometers, 6 to 10 micrometers, 11 to 15 micrometers, 16 to 20 micrometers, 21 to 25 micrometers, 26 to 30 micrometers, or 31 to 100 micrometers, or larger.

The plastic composition comprising conversion material(s) can take many different shapes. For example, the plastic composition comprising the conversion material(s) can have more or fewer bends such that it is U-shaped or V-shaped, or can have different bends with different radiuses of curvature. There can be multiple bends in different locations and different embodiments the plastic composition comprising the coated conversion material(s) can take more complex compound shapes. The plastic composition comprising the conversion material(s) can be rounded or polygonal, for example, the shape can be circular, oval, rectangular, square, pentagon, hexagon, octagon, etc., and/or it can have a more complex shape such as those illustrated in U.S. Patent Publication No. 2011/0140593 to Negley et al. Examples of some more complex shapes include hyperbolic paraboloid shapes, such as doubly ruled surface shaped like a saddle. Desirably, the radius of curvature for the different sections is such that there are no facing surfaces or the number of facing surfaces is minimized. The shape is generally open when viewed from the top. It is understood that the plastic composition comprising the conversion material(s) can take many different compound shapes beyond those described above. For example, a generally open shape comprising multiple edges and surfaces with different radiuses of curvature.

A silicone-coated conversion material(s) in polycarbonate is expected to maintain melt stability with an MVR change of less than or equal to 10% (i.e., MVR is determined at 6 minutes and again at 18 minutes, and the difference between these MVRs is less than or equal to 10% of the 6 minute value).

When testing the 6 minutes (min) MVR of a plastic composition (conversion material(s) in a plastic material (e.g., polycarbonate (PC)) sample) and comparing to the 6 min MVR of the plastic material (e.g., the same plastic material without the conversion material), the addition of the conversion material(s) to plastic should change the 6 min MVR by less than or equal to 30%, specifically, less than or equal to 15%, and more specifically less than or equal to 5%. Similarly, the MVR of the 18 min dwell of the conversion material(s) plastic sample compared to the plastic material, should change by less than or equal to 30%, specifically less than or equal to 10%, and more specifically, less than or equal to 5%. It is also desirable to have a MVR change from the 6 min MVR of the conversion material(s) containing sample compared to the 18 min MVR for the same sample of less than or equal to 20%, specifically, less than or equal to 10%, and more specifically, less than or equal to 5%.

Notched Izod impact (% ductility) at 3.2 mm as determined according to ASTM D256-10 at room temperature (RT) of 23° C. and low temperature (e.g., 0° C.) can be greater than or equal to 80%, specifically, greater than or equal to 90%, and more specifically, 100%.

Lightness (L*) is expected to be greater as well as measured by CIELAB (Reflectance, with a D65 illuminant, and a 10 degree observer). Coated conversion materials will not scrub the inside of the extruder or injection molding machine. Scrubbing leads to graying of the resin and/or the final part. Any unintended color shift either due to resin yellowing or graying will lead to undesirable effects on the total luminous flux and chromaticity across the lifetime of a solid state lighting device. It is desirable to prevent the solid state lighting device from emitting different amounts of light and different colors through its life.

A stable resin system should enable higher reliability where the luminous flux and color coordinates shift is minor and allows greater lumen maintenance. Lumen maintenance may be evaluated according to IES LM-80-08 method, IES TM-21, IESNA methods or any other type of method used to determine lifetime of a solid state lighting product, but not limited to these methods.

A YAG:Ce conversion material or BOSE (boron ortho-silicate) conversion material, for example, can be utilized to convert the blue light to yellow. A reddish AlInGaP LED can be included to pull yellow light from the conversion material to the black body curve. The conversion material can be arranged so that none or a minimal amount of heat from the LEDs passes into the conversion material to avoid heat degradation. The plastic composition can also be shaped to provide a uniform distribution of light from the lamp while minimizing absorption of re-emitted light. In one embodiment, the conversion material comprises YAG:Ce conversion material or BOSE conversion material and a red conversion material so that the lamp emits the desired CRI and color temperature.

The plastic composition can also have different characteristics to provide the desired emission pattern from the lamp. In some embodiments, the conversion material layer can have regions with different thickness, with the sections of greater thickness presenting more conversion material for the light to pass through. In other embodiments the article (e.g., housing) formed from the composition can have different concentrations of conversion materials in different regions. In other embodiments, the plastic composition can also have more than one conversion material mixed throughout, or can have different regions of different conversion materials. The conversion material can also have dispersing agents arranged throughout, or dispersing agents arranged in different concentrations in different regions. The plastic composition can also have regions that are substantially transparent.

Plastic compositions (e.g., polycarbonate) can be manufactured by various methods. For example, a blend of various plastic compositions, e.g. polycarbonate can be fed into the throat of a single or twin-screw extruder via a hopper. Care must be taken so as to not effectuate shear of the conversion material and should limit pressure applied to conversion materials and/polycarbonate material so as to not affect its desired properties.

The final conversion material can be used in plastic material(s) (e.g., polycarbonate or any other thermoplastic resin formulation). During the plastic material's extrusion process, the conversion material(s) can be added upstream or downstream using a side feeder. The conversion material(s) can be added to the melt alone. Optionally, the conversion material(s) can also be added directly to a blender and mixed with resin powder. The advantage of the conversion material(s) in this case is the reduction of the contacts between the abrasive conversion material(s) and the walls or the mixing elements, which reduces the graying issues in the final product and therefore leads to greater luminous flux and color quality in a solid state lighting device that produces white light.

The conversion material can first be compounded into polycarbonate with an appropriate heat stabilizer on a single screw or twin screw extruder in order to wet the surface for production (e.g., a master batch production). Multiple passes through an extruder may be necessary to fully wet the conversion material surface. Such master batches can then be added downstream or at the throat on a dedicated feeder(s) for accurate addition the final polymer formulation in an extruder. When added to the final polymer formulation, only mild distributive mixing is then used to fully disperse the conversion material(s) into the formulation. Examples of processing are further described in commonly assigned U.S. Pat. No. 6,692,659 B2 to Brown et al.

Shaped, formed, or molded articles comprising the thermoplastic compositions are also provided, according to embodiments. The thermoplastic compositions can be molded into useful shaped articles by a variety of means such as injection molding, extrusion, rotational molding, blow molding and thermoforming to form articles such as, for example, computer and business machine housings such as housings for monitors, handheld electronic device housings such as housings for cell phones, electrical connectors, and components of lighting fixtures, ornaments, home appliances, roofs, greenhouses, sun rooms, swimming pool enclosures, thin walled articles such as housing for electronic devices and the like. Additional examples of articles that can be formed from the compositions include electrical parts, such as relays, and enclosures, consumer electronics such as enclosures and parts for laptops, desktops, docking stations, personal digital assistants (PDAs), digital cameras, desktops, and telecommunications parts such as parts for base station terminals. Further examples of articles that can be formed from compositions include light guides, light guide panels, lenses, covers, sheets, films, and the like, e.g., LED lenses, LED covers, and so forth.

In one embodiment, the plastic composition or polycarbonate containing compositions and the conversion material(s) (e.g., coated conversion material(s)) can be employed in a lighting type application, e.g., as a housing for an LED light.

In a further embodiment, the LEDs in a housing formed from the plastic composition can be employed in aviation lighting, automotive lighting, (e.g., brake lamps, turn signals, headlamps, cabin lighting, and indicators), traffic signals, text and video displays and sensors, a backlight of the liquid crystal display device, control units of various products (e.g., for televisions, DVD players, radios, and other domestic appliances), and a dimmable solid state lighting device.

An article (e.g., illumination device such as a light, luminaire, signal, and so forth) can comprise a semiconductor light-emitting element, which emits light (e.g., having a peak wavelength of 370 nm to 470 nm); and a light-emitting portion comprising the composition, wherein the light-emitting portion is excited by the light emitted from the semiconductor light-emitting element to emit light.

A lighting arrangement can comprise: a radiation source configured to emit radiation having a first wavelength range; a conversion material(s) (e.g., coated conversion(s)) material configured to absorb at least a portion of said first wavelength range radiation and emit radiation having a second wavelength range; and an optical component through which at least said first wavelength range radiation passes, wherein the conversion material contained with/dispersed in the optical component.

In a further embodiment, the conversion material is surface coated.

In any of the embodiments disclosed herein, the conversion material(s) can be coated with one or more surface coatings described in this disclosure.

In a further embodiment, the lighting arrangement can further comprise a radiation source, e.g., a light emitting diode (LED) or a light pipe. For example, the lighting arrangement can comprise an LED chip comprising a gallium nitride LED.

Optionally, the radiation source can be operable to emit radiation having a wavelength of 300 nanometers (nm) to 500 nm.

The conversion material can optionally be configured to emit radiation having a wavelength of 450 nm to 700 nm. Desirably, the conversion material emits at a different wavelength than the radiation source.

The lighting arrangement can comprise an optical component (e.g., a lens) having a surface that can be convex, concave, hemispherical, spherical, hollow cylinder, a paraboloid, and planar, as well as combinations comprising at least one of the foregoing. In the various embodiments, the coated conversion material(s) can be within the surface, e.g., can be mixed within the composition that forms the optical component. Optionally, a light diffusing material can be incorporated with the plastic composition. Examples of diffusing materials include: crosslinked polymethylmethacrylate (PMMA), polytetrafluoroethylene (Teflon), and methylsesquioxane (e.g., Tospearl 120 or TSR9004). The housing can be transparent to light from the light source and the coated conversion material, or can comprise a diffusing particle or a diffusing surface to help mix the light as it passes through the housing. Optionally, portions of the housing can be diffusive, while other portions can be transparent or clear.

In an embodiment, an optical component can be for a lighting arrangement of a type comprising a radiation source configured to emit radiation having a first wavelength range. The optical component can comprise a plastic and (e.g., throughout the optical component) a coated conversion material configured to absorb at least a portion of said first wavelength range radiation and emit radiation having a second wavelength range; and said optical component being configured such that at least said first wavelength range radiation passes though the optical component. The radiation source can be a LED (e.g., light emitting diode (LED) chip or die, light emitting polymers (LEPs), polymer light emitting diodes (PLEDs), organic light emitting diodes (OLEDs), or the like) is a solid-state semiconductor device, which can convert electricity directly into light. For example, LED comprises a semiconductor chip, one side of the chip is attached to a stent, the end is negative ("n"), the other side connects to the positive ("p") terminal of the power. The whole chip can optionally be packaged (e.g., coated, encapsulated, and so forth). LEDs, e.g., in the form of an array, can be fashioned on a base (substrate or "PCB" printed circuit board) in thermal communication with a heat sink.

In other words, the semiconductor chip has two parts, one is p-type semiconductor and the other part is the n-type semiconductor. A p-n junction is formed between them when the two semiconductors are connected. An electrical path for supplying control signals to the LEDs can be provided through conductors. The conductors are electrical elements (e.g., strips) applied to a surface of an insulative layer. The insulative layer is mounted to a heat sink. The insulative layer can be a circuit board. The conductor may be any suitable electrically conductive material. Examples of electrically conductive materials include copper, aluminum, or the like, and combinations comprising at least one of the foregoing.

The current acting on the chip causes the emission of energy (e.g., in the form of photons). The wavelength of the light or the color is determined by the material of p-n junction.

It is also contemplated that the polycarbonate composition can be used to form an element or portion of a lighting device that does not require a conversion material.

Ranges articulated within this disclosure, e.g. numerics/values, shall include disclosure for possession purposes and claim purposes of the individual points within the range, sub-ranges, and combinations thereof.

Various combinations of elements of this disclosure are encompassed by this invention, e.g. combinations of elements from dependent claims that depend upon the same independent claim.

The invention is further illustrated by the following non-limiting examples.

EXAMPLES

Testing Procedure & Description of Testing Components

Different composition of flame-retarded additives and PC are mixed together and pre-blended. Extrusion and molding is carried out under normal polycarbonate processing condition. The materials used are shown in Table 1. Amounts shown in the following tables is weight percent based on the combined amounts of the first, second and third polycarbonates.

TABLE 1

| Material | Properties |
|---|---|
| First PC | A branched polycarbonate having structural units derived from bisphenol A, a weight average molecular weight of 30,000 g/mol, a branching level of 3% and end capping groups derived from an end-capping agent having a pKa of 8.3. The branched polycarbonate has a peak melt viscosity of 25,000 poise. |
| Second PC A | A polycarbonate having structural groups derived from bisphenol A and PPPBP. The polycarbonate has a glass transition temperature of 198° C. The amount of PPPBP was 33 mol %. |
| Second PC B | A polycarbonate having structural groups derived from bisphenol A and bisphenol AP. The polycarbonate has a glass transition temperature of 185° C. |
| Second PC ** | A polycarbonate having structural groups derived from bisphenol A and PPPBP. The polycarbonate has a glass transition temperature of 175° C. The amount of PPPBP was 20 mol %. |
| Second PC ** | A polycarbonate having structural groups derived from bisphenol A and PPPBP. The polycarbonate has a glass transition temperature of 210° C. The amount of PPPBP was 40 mol %. |
| APEC 1803 | A polycarbonate having structural groups derived from bisphenol A and cyclohexyl bisphenol. The polycarbonate has a glass transition temperature of 185° C. This material is commercially available from Bayer under the tradename APEC. |
| Third PC A | A polycarbonate having structural units derived from bisphenol A. The molecular weight was 22,000 g/mol. |
| Third PC B | A polycarbonate having structural units derived from bisphenol A. The molecular weight was 31,000 g/mol. |
| Potassium perfluorobutane sulfonate (Rimar salt) | |
| Potassium sulfone sulfonate (KSS) | |

The compositions further comprised an additive package of stabilizers and anti-oxidants with a combined amount of 0.351 weight percent based on 100 parts by weight of the polymer component of the thermoplastic composition.

Melt volume rate was tested as described above at the time interval shown in the tables below. MVR is reported in cubic centimeters per 10 minutes. Heat deformation temperature (HDT) was determined according to ASTM 648 and is reported in degrees Celsius. Multi-axial impact (MAI) was determined according to ASTMD 3763 at 23° C. and a thickness of 3.2 millimeters. MAI is reported in Joules (J). Ductility was tested according to ASTM D3763 and is reported in %. Yellowness index, light transmission, and haze were determined according to ASTM D1003. Yellowness index has no unit of measure, transmission is reported in % and haze is also reported in %.

Flammability testing was conducted using the standard Underwriters Laboratory UL94 test method (7 day conditioning), except that 20 bars rather than the usual 5 bars were tested. Specimens are to be preconditioned in an air-circulating oven for 168 hours at 70±1° C. and then cooled in the desiccator for greater than or equal to 4 hours at room temperature, prior to testing. Once removed from the desiccator, specimens shall be tested within 30 minutes. The data was analyzed by calculation of the average flame out time, standard deviation of the flame out time and the total number of drips. Statistical methods were used to convert the data to a probability that a specific formulation would achieve a first time V0 pass or "p(FTP)" in the standard UL94 testing of 5 bars. Preferably p(FTP) values will be 1 or very close to 1 for high confidence that a sample formulation would achieve a V0 rating in UL94 testing. A p(FTP) value below 0.85 was considered too low to predict a UL94 rating of V0 for that formulation.

Flammability tests were performed following the procedure of Underwriter's Laboratory Bulletin 94 entitled "Tests for Flammability of Plastic Materials, UL94." Several ratings can be applied based on the rate of burning, time to extinguish, ability to resist dripping, and whether or not drips are burning. According to this procedure, materials can be classified as UL94 HB, V0, V1, V2, on the basis of the test results obtained for five samples. The criteria for each of these flammability classifications are described below.

HB: In a 5-inch sample, placed so that the long axis of the sample is horizontal to the flame, the rate of burn of the sample is less than 3 inches per minute, and the flame is extinguished before 4 inches of sample are burned.

V0: In a sample placed so that its long axis is 180 degrees to the flame, the average period of flaming and/or smoldering after removing the igniting flame does not exceed ten seconds and none of the vertically placed samples produces drips of burning particles that ignite absorbent cotton. Five bar flame out time (FOT) is the sum of the flame out time for five bars, each lit twice for a maximum flame out time of 50 seconds.

V1: In a sample placed so that its long axis is 180 degrees to the flame, the average period of flaming and/or smoldering after removing the igniting flame does not exceed twenty-five seconds and none of the vertically placed samples produces drips of burning particles that ignite absorbent cotton. Five bar flame out time is the sum of the flame out time for five bars, each lit twice for a maximum flame out time of 250 seconds.

V2: In a sample placed so that its long axis is 180 degrees to the flame, the average period of flaming and/or smoldering after removing the igniting flame does not exceed twenty-five seconds, but the vertically placed samples produce drips of burning particles that ignite cotton. Five bar flame out time is the sum of the flame out time for five bars, each lit twice for a maximum flame out time of 250 seconds.

DOE

First, a composition DOE (design of experiment) was conducted to determine the blend design space without FR agent. The design space was determined as a function of a set of constraints on practical impact (ductility and impact strength), heat distortion temperature as well as transparency and melt viscosity (for thin wall molding). Some of the data from the DOE is shown in Table 2. As can be seen the data it appears that the design space is quite small, showing the difficulty of obtaining a composition which meets these criteria. The compositions shown in Table 2 additionally comprised 0.39 weight percent of an additive package comprising a stabilizer, an anti-oxidant and a release agent.

TABLE 2

|  | A | B | C | D | E | F | G | H |
|---|---|---|---|---|---|---|---|---|
| First PC | 15 | 30 | 45 | 30 | 22.5 | 45 | 15 | 37.5 |
| Second PC A | 75 | 26.25 | 45 | 15 | 56.25 | 15 | 45 | 33.75 |
| Third PCA | 5 | 21.9 | 5 | 27.5 | 10.6 | 20 | 20 | 14.4 |
| Third PC B | 5 | 21.85 | 5 | 27.5 | 10.65 | 20 | 20 | 14.35 |
| Impact | 67.9 | 68.1 | 56.4 | 70 | 67.3 | 65.7 | 67.7 | 68.7 |
| Ductility | 20 | 100 | 60 | 100 | 100 | 100 | 100 | 100 |
| HDT | — | 134.6 | 142.1 | 130.7 | 148.8 | 130.4 | 145.5 | 139.3 |

Examples 1-7

Examples as shown in Table 3 were made and tested for MVR, ductility, multi-axial impact strength (MAI), and flame retardance. Results are shown in Table 3 as well.

TABLE 3

|  | 1 | 2* | 3 | 4* | 5* | 6* | 7 |
|---|---|---|---|---|---|---|---|
| First PC | 37.5 | 37.5 | 37.5 | — | 37.5 | 37.5 | 37.5 |
| Second PC A | 33.8 | 33.8 | 33.8 | 33.8 | 33.8 | 33.8 | 33.8 |
| Third PC B | 28.7 | — | — | 37.5 | 28.7 | — | — |
| Third PC A | — | 28.7 | 28.7 | 28.7 | — | 28.7 | 28.7 |
| Rimar salt | 0.08 | — | 0.08 | 0.08 | — | — | 0.08 |
| MVR (360 seconds) | 15.3 | 27.8 | 23.6 | 42.4 | 14.5 | 24.8 | 24.7 |
| MVR (1080 seconds) | 16 | 32.7 | 27.5 | 42.8 | 16 | 27.6 | 28 |
| Ductility | 100 | 100 | 100 | 100 | 100 | 100 | 100 |
| MAI | 60.7 | 60.4 | 63.8 | 71.2 | 59.2 | 61.8 | 54.9 |
| p(FTP) @ 1.5 mm | 0.99 | 0 | 0.99 | 0 | 0 | 0 | 0.99 |
| p(FTP) @ 1.0 mm | 0.99 | — | 0.99 | — | — | — | 0.99 |

*Comparative Examples

Table 2 shows that the combination of a branched polycarbonate, a high heat polycarbonate, and Rimar salt (potassium perfluorobutane sulfonate) is required to obtain a V0 rating at 1.0 mm. Compositions without the Rimar salt (Samples 2, 5 and 6) and the branched polycarbonate (Sample 4) all failed to achieve a V0 at 1.0 mm. Additionally, the inclusion of a third polycarbonate allows manipulation of the MVR value (see Examples 1 and 3).

Examples 8-13

Compositions using different high heat polycarbonates (different polycarbonates having a Tg greater than 170° C.) were made and tested. Results are shown in Table 4.

TABLE 4

|  | 8 | 9* | 10 | 11 | 12 |
|---|---|---|---|---|---|
| First PC | 37.5 | 37.5 | 37.5 | 28.3 | 37.5 |
| Second PC A | 33.8 | — | — | — | — |
| APEC | — | 33.8 | 33.8 | 50 | — |
| Second PC B | — | — | — | — | 33.8 |
| Third PC A | 28.7 | 28.7 | 28.7 | 21.7 | 28.7 |
| Rimar | 0.08 | — | 0.08 | 0.08 | 0.08 |
| MVR (360 seconds) | 23.6 | 19 | 19.9 | 18.8 | 50.8 |
| MVR (1080 seconds) | 27.5 | 21 | 21.3 | 20.4 | 32.5 |
| Ductility |  |  |  |  |  |
| p(FTP) @ 1.5 mm | — | — | — | — | 0.99 |
| p(FTP) @ 1.2 mm | — | 0 | 0.5 | 0.6 | — |
| p(FTP) @ 1.0 mm | 0.99 | — | — | — | — |
| HDT | 149 | 147 | 146 | 151 | 152 |
| Yellowing index (3.2 mm) | 2.7 | — | — | — | 10 |
| Transmission (3.2 mm) | 88.8 | — | — | — | 81.2 |
| Haze (3.2 mm) | 0.7 | — | — | — | 3.7 |

*Comparative Example

Examples 9-11 demonstrate that a high heat polycarbonate formed from a bisphenol comprising an aromatic group between the two phenol groups is required for flame retardance at thicknesses below 1.5 mm. Additionally, composition comprising a high heat polycarbonate formed from bisphenol A and PPPBP demonstrate excellent optical properties (low yellowing, high transmission and low haze).

Examples 13-21

Examples 13-21 used potassium sulfone sulfonate (KSS) in place of Rimar salt. The high heat polycarbonate was formed from bisphenol A and PPPBP. Composition and results are shown in Table 5.

TABLE 5

|  | 13* | 14 | 15 | 16 | 17 | 18 | 19 | 20 | 21 |
|---|---|---|---|---|---|---|---|---|---|
| First PC | 37.5 | 37.5 | 37.5 | 37.5 | 37.5 | 37.5 | 37.5 | 37.5 | 37.5 |
| Second PC A | 33.8 | 33.8 | 33.8 | 33.8 | 33.8 | 33.8 | 33.8 | 33.8 | 33.8 |
| Third PC A | 28.7 | 28.7 | 28.7 | 28.7 | 28.7 | 28.7 | 28.7 | 28.7 | 28.7 |
| KSS | — | 0.01 | 0.05 | 0.1 | 0.2 | 0.3 | 0.4 | 0.5 | 0.4 |
| MVR (360 seconds) | 24.3 | 24.6 | 21.3 | 20 | 26.5 | 22.6 | 31.2 | 34 | 25.7 |
| MVR (1080 seconds) | 26 | 26.6 | 27.1 | 27.2 | 28.6 | 30.2 | 30.2 | 30.6 | 31 |
| p(FTP) @ 1.5 mm | 0 | 0.1 | 0.6 | 0.8 | 0.9 | 0.8 | 0.7 | 0.8 | 0.6 |
| p(FTP) @ 1.0 mm | 0 | 0 | 0 | 0 | 0 | 0 | 0 | 0 | 0 |
| HDT | 148 | 149 | 149 | 150 | 148 | 150 | 149 | 149 | 148 |
| Yellowing index (3.2 mm) | 4 | 3.2 | 11.9 | 2.9 | 3.3 | 3.1 | 3.4 | 3.5 | 3.1 |
| Transmission (3.2 mm) | 88.1 | 88.7 | 84.8 | 89 | 88.8 | 88.8 | 88.7 | 88.6 | 88.9 |
| Haze (3.2 mm) | 2.3 | 1.4 | 1.9 | 1.1 | 1.3 | 1.2 | 1.5 | 1.8 | 1.2 |

Examples 13-21 show that good flame retardance and other physical properties can be obtained with KSS, particularly when the KSS is used in amounts of 0.1 to 0.4 weight percent, more particularly 0.1 to 0.3 weight percent. Contrary to expectation, flame retardance actually decreases with increasing amounts of KSS over 0.3 weight percent.

Examples 22-27

Examples 22-27 were made as described above and examine the effect of differing amounts of the PPPBP monomer on the properties of the overall composition.

TABLE 6

|  | 23* | 24 | 25* | 26 | 27* | 28 |
|---|---|---|---|---|---|---|
| First PC | 37.5 | 37.5 | 37.5 | 37.5 | 37.5 | 37.5 |
| Second PC A | 33.8 | 33.8 | 0 | 0 | 0 | 0 |
| Second PC C | 0 | 0 | 33.8 | 33.8 | 0 | 0 |
| Second PC D | 0 | 0 | 0 | 0 | 33.8 | 33.8 |
| Third PC B | 28.7 | 28.7 | 28.7 | 28.7 | 28.7 | 28.7 |
| Potassium Perfluorobutane Sulfonate (Rimar) | 0 | 0.08 | 0 | 0.08 | 0 | 0.08 |
| MVR (330C, 2.16 Kg, 360s) | 13.8 | 15.8 | 17.4 | 17.5 | 12.4 | 12.9 |
| MVR (330C, 2.16 Kg, 1080s) | 16.7 | 17.5 | 19.3 | 19.2 | 13.6 | 14.4 |
| MAI Energy to max load (23° C., 3.2 mm) | 57.3 | 53.6 | 48.5 | 49.7 | 48.9 | 51 |
| MAI Ductility (23° C., 3.2 mm) | 100 | 80 | 100 | 100 | 100 | 100 |
| HDT (0.455 Mpa, 3.2 mm) | — | — | — | 148.2 | 154.3 | 153.6 |
| Yellowness Index @ 3.2 mm | 3.3 | 3.5 | 4.3 | 4.5 | 5.1 | X |
| Transmission @ 3.2 mm | 87.4 | 88.5 | 81.5 | 88.3 | 87.2 | X |
| Haze @ 3.2 mm | 2.4 | 1.7 | 1.8 | 2.4 | 4.6 | X |
| p(FTP) @ 1.5 mm | 0 | 0.99 | 0 | 0.91 | 0 | 0.99 |
| p(FTP) @ 1.2 mm | 0 | 0.96 | 0 | 0.67 | 0 | 0.9 |
| p(FTP) @ 1.0 mm | 0 | 0.6 | 0 | 0.5 | 0 | 0.94 |
| p(FTP) @ 0.8 mm | 0 | 0.81 | 0 | 0 | 0 | 0 |

*Comparative Example

These examples demonstrate that at thicknesses less than or equal to 1.2 millimeters it can be desirable to use a second PC having greater than 20 mol % PPPBP content.

Set forth below are some examples of the composition.

Embodiment 1

A composition comprising a flame retardant comprising a sulfonate salt; 15 to 50 weight percent of a first polycarbonate, wherein the first polycarbonate comprises structural units of formula (I)

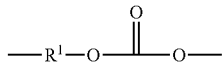

wherein at least 60 percent of the total number of $R^1$ groups comprise aromatic groups and the balance thereof are aliphatic or alicyclic groups, and terminal groups derived from an end-capping agent, wherein the first polycarbonate has a branching level of greater than or equal to 2%, a weight average molecular weight of 20,000 to 55,000 g/mol as measured by gel permeation chromatography using polycarbonate standards, and a peak melt viscosity greater than or equal to 25,000 poise when measured using a parallel plate melt rheology test at a heating rate of 10 degrees C/minute at a temperature of 350 to 450° C. at a frequency of 3 radians/second and a strain amplitude of 9%; 20 to 50 weight percent of a second polycarbonate having a glass transition temperature greater than or equal to 170° C., wherein the second polycarbonate comprises structural units derived from HO-$A^1$-$Y^2$-$A^2$-OH and structural units derived from HO-$A^1$-$Y^2$-$A^2$-OH wherein each of $A^1$ and $A^2$ is a monocyclic divalent aryl group, $Y^1$ is an aliphatic bridging group or bridging group comprising one to three atoms with the proviso that at least one of the atoms is a hetero atom, and $Y^2$ is an aromatic group having 6 to 30 carbon atoms, and 15 to 50 weight percent of a third polycarbonate comprising structural units derived from bisphenol A and having a branching level of 0 to less than 2%, and a molecular weight of 17,000 to 40,000 g/mol as measured by gel permeation chromatography using polycarbonate standards, wherein weight percent is based on the combined weight of the first, second and third polycarbonates and the composition has a heat distortion temperature greater than or equal to 145° C., ductility greater than or equal to 90% at 23 degrees C., multi-axial impact greater than or equal to 50 J/m at 23° C., and a molded article of the composition has a UL 94 V0 rating at a thickness of 1.5 mm.

Embodiment 2

The composition of Embodiment 1, wherein the flame retardant comprises potassium perfluorobutane sulfonate.

Embodiment 3

The composition of either of Embodiments 1 or 2, wherein the end-capping agent comprises phenol or a phenol containing one or more substitutions comprising aliphatic groups, olefinic groups, aromatic groups, halogens, ester groups, ether groups, halogens, cyano groups, or combinations thereof.

Embodiment 4

The composition of any of Embodiments 1 to 3, wherein the end-capping agent comprises phenol, p-t-butylphenol, p-cumylphenol, or combinations thereof.

Embodiment 5

The composition of any of Embodiments 1 or 2, wherein the end-capping agent has a pKa of 8.3 to 11.

Embodiment 6

The composition of any of Embodiments 1 to 5, wherein the first polycarbonate has an MVR of 10 to 200 cm³/10 min.

Embodiment 7

The composition of any of Embodiments 1 to 6, wherein the first polycarbonate has a branching level of greater than or equal to 3%.

Embodiment 8

The composition of any of Embodiments 1 or 3 to 7, wherein the flame-retardant comprises a potassium perfluorobutane sulfonate salt greater in an amount greater than about 0.04 wt. % based upon the total weight of polycarbonate resin in the composition.

Embodiment 9

The composition of any of Embodiments 1 to 8, wherein the flame-retardant excludes a chlorine or bromine containing composition.

Embodiment 10

The composition of any of Embodiments 1 to 9, wherein the branching agent comprises THPE, TMTC, isatin-bisphenol, or combinations thereof

Embodiment 11

The composition of any of Embodiments 1 to 10, wherein the first polycarbonate has a weight-average molecular weight of 20,000 g/mole to 40,000 g/mole as measured by gel permeation chromatography using polycarbonate standards.

Embodiment 12

The composition of any of Embodiments 1 to 11, wherein the first polycarbonate is a homopolycarbonate derived from a bisphenol A.

Embodiment 13

The composition of any of Embodiment 1 to 12, wherein the first polycarbonate is a copolycarbonate derived from more than one bisphenol.

Embodiment 14

The composition of any of Embodiments 1 to 13, wherein the second polycarbonate comprises units derived from bisphenol A and PPPBP.

Embodiment 15

The composition of any of Embodiments 14, wherein the structural units derived from PPPBP are present in an amount of 20-40 mol %, based on the total moles of structural units.

Embodiment 16

The composition of any of Embodiments 1 to 15, wherein the composition has a haze value of less than 1.5% at 3.2 mm thickness as determined by ASTM D1003.

Embodiment 17

The composition of any of Embodiments 1 to 16, further comprising one or more additives.

Embodiment 18

The composition of Embodiment 17, wherein the additives comprise UV stabilizing additives, thermal stabilizing additives, mold release agents, colorants, organic fillers, inorganic fillers, gamma-stabilizing agents, or combinations thereof.

Embodiment 19

The composition of any of Embodiment 1 to 18, wherein the composition is free of fluorine.

Embodiment 20

The composition of any of Embodiments 1 to 19, having a transmission value greater than or equal to 85% at 3.2 mm thickness as determined by ASTM D1003.

Embodiment 21

An article comprising the composition of any of Embodiments 1 to 20.

Embodiment 22

A composition comprising potassium perfluorobutane sulfonate; 15 to 50 weight percent of a first polycarbonate, wherein the first polycarbonate comprises structural units of formula (I)

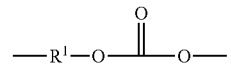

wherein at least 60 percent of the total number of $R^1$ groups comprise aromatic groups and the balance thereof are aliphatic or alicyclic groups, and terminal groups derived from an end-capping agent, wherein the first polycarbonate has a branching level of greater than or equal to 2%, a weight average molecular weight of 20,000 to 55,000 g/mol as measured by gel permeation chromatography using polycarbonate standards, and a peak melt viscosity greater than or equal to 25,000 poise when measured using a parallel plate melt rheology test at a heating rate of 10 degrees C/minute at a temperature of 350 to 450 degree C. at a frequency of 3 radians/second and a strain amplitude of 9%; 20 to 50 weight percent of a second polycarbonate having a glass transition temperature greater than or equal to 170° C., wherein the second polycarbonate comprises structural units derived from HO-$A^1$-$Y^1$-$A^2$-OH and structural units derived from HO-$A^1$-$Y^2$-$A^2$-OH wherein each of $A^1$ and $A^2$ is a monocyclic divalent aryl group, $Y^1$ is an aliphatic bridging group or bridging group comprising one to three atoms with the proviso that at least one of the atoms is a hetero atom, and $Y^2$ is an aromatic group having 6 to 30 carbon atoms, and 15 to 50 weight percent of a third polycarbonate comprising structural units derived from bisphenol A and having a branching level of 0 to less than 2%, and a molecular weight of 17,000 to 40,000 g/mol as measured by gel permeation chromatography using polycarbonate standards wherein weight percent is based on the combined weight of the first, second and third polycarbonates and the composition has a heat distortion temperature greater than or equal to 145° C., ductility greater than or equal to 90% at 23° C., multi-axial impact greater than or equal to 50 J/m at 23° C., and a molded article of the composition has a UL 94 V0 rating at a thickness of 1.0 mm.

Embodiment 23

A composition comprising potassium sulfone sulfonate; 15 to 50 weight percent of a first polycarbonate, wherein the first polycarbonate comprises structural units of formula (I)

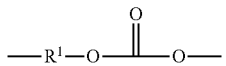

wherein at least 60 percent of the total number of $R^1$ groups comprise aromatic groups and the balance thereof are aliphatic or alicyclic groups, and terminal groups derived from an end-capping agent, wherein the first polycarbonate has a branching level of greater than or equal to 2%, a weight average molecular weight of 20,000 to 55,000 g/mol as measured by gel permeation chromatography using polycarbonate standards, and a peak melt viscosity greater than or equal to 25,000 poise when measured using a parallel plate melt rheology test at a heating rate of 10 degrees C/minute at a temperature of 350 to 450 degree C. at a frequency of 3 radians/second and a strain amplitude of 9%; 20 to 50 weight percent of a second polycarbonate having a glass transition temperature greater than or equal to 170° C., wherein the second polycarbonate comprises structural units derived from HO-$A^1$-$Y^1$-$A^2$-OH and structural units derived from HO-$A^1$-$Y^2$-$A^2$-OH wherein each of $A^1$ and $A^2$ is a monocyclic divalent aryl group, $Y^1$ is an aliphatic bridging group or bridging group comprising one to three atoms with the proviso that at least one of the atoms is a hetero atom, and $Y^2$ is an aromatic group having 6 to 30 carbon atoms, and 15 to 50 weight percent of a third polycarbonate comprising structural units derived from bisphenol A and having a branching level of 0 to less than 2%, and a molecular weight of 17,000 to 40,000 g/mol as measured by gel permeation chromatography using polycarbonate standards, wherein weight percent is based on the combined weight of the first, second and third polycarbonates and the composition has a heat distortion temperature greater than or equal to 145° C., ductility greater than or equal to 90% at 23 degrees C., multi-axial impact greater than or equal to 50 J/m at 23° C., and a molded article of the composition has a UL 94 V0 rating at a thickness of 1.2 mm.

Embodiment 24

A composition comprising: potassium perfluorobutane sulfonate; 15 to 50 weight percent of a first polycarbonate, wherein the first polycarbonate comprises structural units of derived from bisphenol A, wherein the first polycarbonate has a branching level of greater than or equal to 2%, a weight average molecular weight of 20,000 to 55,000 g/mol as measured by gel permeation chromatography using polycarbonate standards, and a peak melt viscosity greater than or equal to 25,000 poise when measured using a parallel plate melt rheology test at a heating rate of 10 degrees C/minute at a temperature of 350 to 450 degree C. at a frequency of 3 radians/second and a strain amplitude of 9%; 20 to 50 weight percent of a second polycarbonate having a glass transition temperature greater than or equal to 170° C., wherein the second polycarbonate comprises structural units derived from bisphenol A and PPPBP and the structural units derived from PPPBP are present in an amount of 20-40 mol % based on the total number of moles of structural units, and 15 to 50 weight percent of a third polycarbonate comprising structural units derived from bisphenol A and having a branching level of 0 to less than 2%, and a molecular weight of 17,000 to 40,000 g/mol as measured by gel permeation chromatography using polycarbonate standards wherein weight percent is based on the combined weight of the first, second and third polycarbonates and the composition has a heat distortion temperature greater than or equal to 145° C., ductility greater than or equal to 90% at 23° C., multi-axial impact greater than or equal to 50 J/m at 23° C., and a molded article of the composition has a UL 94 V0 rating at a thickness of 1.0 mm.

Embodiment 25

A composition comprising potassium sulfone sulfonate; 15 to 50 weight percent of a first polycarbonate, wherein the first polycarbonate comprises structural units of derived from bisphenol A, wherein the first polycarbonate has a branching level of greater than or equal to 2%, a weight average molecular weight of 20,000 to 55,000 g/mol as measured by gel permeation chromatography using polycarbonate standards, and a peak melt viscosity greater than or equal to 25,000 poise when measured using a parallel plate melt rheology test at a heating rate of 10 degrees C/minute at a temperature of 350 to 450 degree C. at a frequency of 3 radians/second and a strain amplitude of 9%; 20 to 50 weight percent of a second polycarbonate having a glass transition temperature greater than or equal to 170° C., wherein the second polycarbonate comprises structural units derived from bisphenol A and PPPBP and the structural units derived from PPPBP are present in an amount of 20-40 mol % based on the total number of moles of structural units, and 15 to 50 weight percent of a third polycarbonate comprising structural units derived from bisphenol A and having a branching level of 0 to less than 2%, and a molecular weight of 17,000 to 40,000 g/mol as measured by gel permeation chromatography using polycarbonate standards wherein weight percent is based on the combined weight of the first, second and third polycarbonates and the composition has a heat distortion temperature greater than or equal to 145° C., ductility greater than or equal to 90% at 23° C., multi-axial impact greater than or equal to 50 J/m at 23° C., and a molded article of the composition has a UL 94 V0 rating at a thickness of 1.2 mm.

While typical embodiments have been set forth for the purpose of illustration, the foregoing descriptions should not be deemed to be a limitation on the scope herein. Accordingly, various modifications, adaptations, and alternatives can occur to one skilled in the art without departing from the spirit and scope herein.

The invention claimed is:

1. A light emitting device, comprising:
a lighting element located in a housing, wherein the housing is formed from a plastic composition comprising:
a conversion material, wherein the conversion material comprises yttrium aluminum garnet (YAG) doped with a rare earth element, terbium aluminum garnet doped with a rare earth element, silicate (BOSE) doped with a rare earth element, nitrido silicate doped with a rare earth element; nitride orthosilicate doped with a rare earth element, oxonitridoaluminosilicate doped with a rare earth element or a combination thereof; and a polycarbonate composition
and the polycarbonate composition comprises:
a flame retardant comprising a sulfonate salt;
15 to 50 weight percent of a first polycarbonate, wherein the first polycarbonate comprises structural units of formula (I)

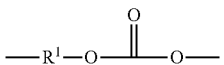

wherein at least 60 percent of the total number of $R^1$ groups comprise aromatic groups and the balance thereof are aliphatic or alicyclic groups, and terminal groups derived from an end-capping agent, wherein the first polycarbonate has a branching level of greater than or equal to 2%, a weight average molecular weight of 20,000 to 55,000 g/mol as measured by gel permeation chromatography using polycarbonate standards, and a peak melt viscosity greater than or equal to 25,000 poise when measured using a parallel plate melt rheology test at a heating rate of 10 degrees C./minute at a temperature of 350 to 450 degree C. at a frequency of 3 radians/second and a strain amplitude of 9%;
20 to 50 weight percent of a second polycarbonate having a glass transition temperature greater than or equal to 170° C., wherein the second polycarbonate comprises structural units derived from HO-$A^1$-$Y^1$-$A^2$-OH and structural units derived from HO-$A^1$-$Y^2$-$A^2$-OH wherein each of $A^1$ and $A^2$ is a monocyclic divalent aryl group, $Y^1$ is an aliphatic bridging group or bridging group comprising one to three atoms with the proviso that at least one of the atoms is a hetero atom, and $Y^2$ is an aromatic group having 6 to 30 carbon atoms, and
15 to 50 weight percent of a third polycarbonate comprising structural units derived from bisphenol A and having a branching level of 0 to less than 2%, and a molecular weight of 17,000 to 40,000 g/mol as measured by gel permeation chromatography using polycarbonate standards, wherein weight percent is based on the combined weight of the first, second and third polycarbonates and the composition has a heat distortion temperature greater than or equal to 145° C., ductility greater than or equal to 90% at 23 degrees C., multi-axial impact greater than or equal to 50 J/m at 23° C., and a molded article of the composition has a UL 94 V0 rating at a thickness of 1.5 mm; and
wherein after the conversion material has been exposed to an excitation source, the conversion material has a luminescence lifetime of less than $10^{-4}$ seconds when the excitation source is removed.

2. The device of claim 1, wherein the plastic composition comprises 0.1 to 40 pbw of the conversion material based on 100 pbw of polycarbonate composition.

3. The device of claim 1, wherein the plastic composition comprises 4 to 20 pbw of the conversion material based on 100 pbw of polycarbonate composition.

4. The device of claim 1, wherein the plastic composition has a 6 min MVR that is less than or equal to 30% greater than a polycarbonate composition 6 min MVR.

5. The device of claim 1, wherein the conversion material comprises
a conversion material having the formula:

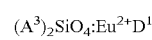

wherein $A^3$ is a divalent metal comprising Sr, Ca, Ba, Mg, Zn, Cd, or a combination thereof;
and $D^1$ is a dopant comprising F, Cl, Br, I, P, S, N, or a combination thereof.

6. The device of claim 1, wherein the conversion material comprises
a conversion material having formula:

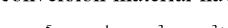

where $A^5$ is a trivalent metal comprising Gd, Tb, La, Sm, or a combination thereof, or a divalent metal ion comprising Sr, Ca, Ba, Mg, Zn, Cd, or a combination thereof; $B^1$ is comprises Si, B, P, Ga, or a combination thereof; and $D^3$ is a dopant comprising F, Cl, Br, I, P, S, N, or a combination thereof.

7. The device of claim 1, wherein the conversion material comprises
an orange-red silicate-based conversion material having formula:

wherein M1 comprises Ba, Ca, Mg, Zn, or a combination thereof; and $D^4$ comprises F, Cl, S, N, or a combination thereof.

8. The device of claim 1, wherein the conversion material comprises
an $Eu^2$ and/or $Dy^{3+}$ doped conversion material having formula:

wherein M comprises Ca, Sr, Ba, or a combination thereof.

9. The device of claim 1, wherein the conversion material comprises
a rare earth doped a red silicon nitride based conversion material having a formula:

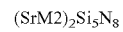

wherein M2 comprises Sr, Ca, Mg, Zn, or a combination thereof.

10. The device of claim 1, wherein the conversion material comprises
a rare earth doped a red sulfate based conversion material having formula:

wherein M3 comprises Ca, Ba, Mg, or a combination thereof.

11. The device of claim 1, wherein the conversion material is a green sulfate based conversion material having formula:

wherein M3 comprises Ca, Ba, Mg, or a combination thereof; and M4 comprises Al, In, or a combination thereof.

12. The device of claim 1, wherein the conversion material is comprises a strontium silicate yellow conversion material; a yttrium aluminum garnet doped with rare earth element; a terbium aluminum garnet doped with a rare earth element; a silicate conversion material; nitride conversion material; nitrido silicate; nitride orthosilicate; oxonitridoaluminosilicate; or a combination thereof.

13. The device of claim 1, wherein the conversion material comprises a combinations of yellow conversion material with a red conversion material; a combinations of green and red conversion material; semiconductor nanocrystals of cadmium sulfide mixed with manganese; or a combination thereof.

14. The device of claim 1, wherein the conversion material comprises an amorphous silica coating.

15. The device of claim 1, wherein housing has a transparency of greater than or equal to 30% measured according to ASTM D1003-00, Procedure B, illuminant C, on a spectrophotometer, at a thickness of 1.04 mm.

16. The device of claim 1, wherein the plastic composition further comprises a light diffusing material selected from crosslinked polymethylmethacrylate (PMMA), polytetrafluoroethylene, and methylsesquioxane, or a combination thereof.

17. The device of claim 1, wherein the sulfonate salt is Rimar salt, the first polycarbonate comprises structural units derived from bisphenol A, the second polycarbonate comprises structural units derived from PPPBP and bisphenol A and a molded article of the composition has a UL 94 V0 rating at a thickness of 1.0 mm.

18. The device of claim 1, wherein the sulfonate salt is potassium perfluorobutane sulfonate, the first polycarbonate comprises structural units derived from bisphenol A, the second polycarbonate comprises structural units derived from PPPBP and bisphenol A and a molded article of the composition has a UL 94 V0 rating at a thickness of 1.2 mm.

19. The device of claim 1, wherein the conversion material is coated with 0.05 wt % to 20 wt % silicone oil based upon the weight of the conversion material and silicone oil.

20. The device of claim 19, wherein the silicone oil comprises hydrogen-alkyl siloxane oil; polydialkyl siloxane oil; polydimethyl siloxane codiphenyl siloxane, dihydroxy terminated, or a combination thereof.

21. The device of claim 1, wherein the plastic composition, after extrusion, has a 6 minute dwell time MVR and an 18 minute dwell time MVR, and wherein a difference between the 6 minute dwell time MVR and the 18 minute dwell time MVR is less than or equal to 30% of the 6 minute dwell time MVR.

22. The device of claim 21, wherein the plastic composition has a 6 min MVR that is less than or equal to 5% greater than the polycarbonate composition 6 min MVR.

23. The device of claim 1, wherein the plastic composition further comprises greater than 0 to 1 pbw, based upon 100 pbw of polycarbonate composition, of scattering particles, interference particles, color absorbing particles, or a combination thereof.

24. The device of claim 23, wherein the plastic composition comprises 0.001 pbw to 0.3 pbw scattering particles, based upon 100 pbw of polycarbonate composition.

25. A device of claim 1, wherein the device is at least one of the following: a lamp, illumination device, lighting device for applications in the interior and exterior area, vehicle lighting, internal lighting of residential and work rooms, backlight units of LCD screens, and accent lighting.

26. The device of claim 25, further comprising a dimmer configured to reduce an amount of light emitted from the device.

27. A plastic molded device, wherein the molded device is formed from the plastic composition comprising
a conversion material, wherein the conversion material comprises yttrium aluminum garnet (YAG) doped with a rare earth element, terbium aluminum garnet doped with a rare earth element, silicate (BOSE) doped with a rare earth element; nitrido silicate doped with a rare earth element; nitride orthosilicate doped with a rare earth element, oxonitridoaluminosilicate doped with a rare earth element, or a combination thereof; and a polycarbonate composition
and the polycarbonate composition comprises:
a flame retardant comprising a sulfonate salt;
15 to 50 weight percent of a first polycarbonate, wherein the first polycarbonate comprises structural units of formula (I)

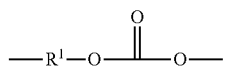

wherein at least 60 percent of the total number of $R^1$ groups comprise aromatic groups and the balance thereof are aliphatic or alicyclic groups, and terminal groups derived from an end-capping agent, wherein the first polycarbonate has a branching level of greater than or equal to 2%, a weight average molecular weight of 20,000 to 55,000 g/mol as measured by gel permeation chromatography using polycarbonate standards, and a peak melt viscosity greater than or equal to 25,000 poise when measured using a parallel plate melt rheology test at a heating rate of 10 degrees C./minute at a temperature of 350 to 450 degree C. at a frequency of 3 radians/second and a strain amplitude of 9%;
20 to 50 weight percent of a second polycarbonate having a glass transition temperature greater than or equal to 170° C., wherein the second polycarbonate comprises structural units derived from HO-$A^1$-$Y^1$-$A^2$-OH and structural units derived from HO-$A^1$-$Y^2$-$A^2$-OH wherein each of $A^1$ and $A^2$ is a monocyclic divalent aryl group, $Y^1$ is an aliphatic bridging group or bridging group comprising one to three atoms with the proviso that at least one of the atoms is a hetero atom, and $Y^2$ is an aromatic group having 6 to 30 carbon atoms, and
15 to 50 weight percent of a third polycarbonate comprising structural units derived from bisphenol A and having a branching level of 0 to less than 2%, and a molecular weight of 17,000 to 40,000 g/mol as measured by gel permeation chromatography using polycarbonate standards, wherein weight percent is based on the combined weight of the first, second and third polycarbonates and the composition has a heat distortion temperature greater than or equal to 145° C., ductility greater than or equal to 90% at 23 degrees C., multi-axial impact greater than or equal to 50 J/m at 23° C., and a molded article of the composition has a UL 94 V0 rating at a thickness of 1.5 mm; and
wherein after the conversion material has been exposed to an excitation source, the conversion material has a luminescence lifetime of less than $10^{-4}$ seconds when the excitation source is removed.

28. A light emitting device, comprising:
a radiation source; and
an emitting portion in optical communication with the radiation source, wherein the emitting portion is formed from a plastic composition, wherein the plastic composition comprises:
a conversion material, wherein the conversion material comprises yttrium aluminum garnet (YAG) doped with a rare earth element, terbium aluminum garnet doped with a rare earth element, silicate (BOSE) doped with a rare earth element; nitrido silicate doped with a rare earth element; nitride orthosilicate doped with a rare earth element, oxonitridoaluminosilicate doped with a rare earth element, or a combination thereof;
a polycarbonate composition and the polycarbonate composition comprises:
a flame retardant comprising a sulfonate salt;
15 to 50 weight percent of a first polycarbonate, wherein the first polycarbonate comprises structural units of formula (I)

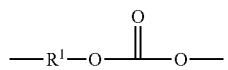

wherein at least 60 percent of the total number of $R^1$ groups comprise aromatic groups and the balance thereof are aliphatic or alicyclic groups, and terminal groups derived from an end-capping agent, wherein the first polycarbonate has a branching level of greater than or equal to 2%, a weight average molecular weight of 20,000 to 55,000 g/mol as measured by gel permeation chromatography using polycarbonate standards, and a peak melt viscosity greater than or equal to 25,000 poise when measured using a parallel plate melt rheology test at a heating rate of 10 degrees C./minute at a temperature of 350 to 450 degree C. at a frequency of 3 radians/second and a strain amplitude of 9%;
20 to 50 weight percent of a second polycarbonate having a glass transition temperature greater than or equal to 170° C., wherein the second polycarbonate comprises structural units derived from HO-$A^1$-$Y^1$-$A^2$-OH and structural units derived from HO-$A^1$-$Y^2$-$A^2$-OH wherein each of $A^1$ and $A^2$ is a monocyclic divalent aryl group, $Y^1$ is an aliphatic bridging group or bridging group comprising one to three atoms with the proviso that at least one of the atoms is a hetero atom, and $Y^2$ is an aromatic group having 6 to 30 carbon atoms, and
15 to 50 weight percent of a third polycarbonate comprising structural units derived from bisphenol A and having a branching level of 0 to less than 2%, and a molecular weight of 17,000 to 40,000 g/mol as measured by gel permeation chromatography using polycarbonate standards, wherein weight percent is based on the combined weight of the first, second and third polycarbonates and the composition has a heat distortion temperature greater than or equal to 145° C., ductility greater than or equal to 90% at 23 degrees C., multi-axial impact greater than or equal to 50 J/m at 23° C., and a molded article of the composition has a UL 94 VO rating at a thickness of 1.5 mm;
wherein after the conversion material has been exposed to an excitation source, the conversion material has a luminescence lifetime of less than $10^{-4}$ seconds when the excitation source is removed.

29. A lighting device, comprising:
a radiation source configured to emit radiation having a first wavelength range;
an optical component comprising a plastic composition comprising:
a conversion material, wherein the conversion material comprises yttrium aluminum garnet (YAG) doped with a rare earth element, terbium aluminum garnet doped with a rare earth element, silicate (BOSE) doped with a rare earth element; nitrido silicate doped with a rare earth element; nitride orthosilicate doped with a rare earth element, oxonitridoaluminosilicate doped with a rare earth element, or a combination thereof;
a polycarbonate composition and the polycarbonate composition comprises:
a flame retardant comprising a sulfonate salt;
15 to 50 weight percent of a first polycarbonate, wherein the first polycarbonate comprises structural units of formula (I)

wherein at least 60 percent of the total number of $R^1$ groups comprise aromatic groups and the balance thereof are aliphatic or alicyclic groups, and terminal groups derived from an end-capping agent, wherein the first polycarbonate has a branching level of greater than or equal to 2%, a weight average molecular weight of 20,000 to 55,000 g/mol as measured by gel permeation chromatography using polycarbonate standards, and a peak melt viscosity greater than or equal to 25,000 poise when measured using a parallel plate melt rheology test at a heating rate of 10 degrees C./minute at a temperature of 350 to 450 degree C. at a frequency of 3 radians/second and a strain amplitude of 9%;
20 to 50 weight percent of a second polycarbonate having a glass transition temperature greater than or equal to 170° C., wherein the second polycarbonate comprises structural units derived from HO-$A^1$$Y^1$-$A^2$-OH and structural units derived from HO-$A^1$-$Y^2$-$A^2$-OH wherein each of $A^1$ and $A^2$ is a monocyclic divalent aryl group, $Y^1$ is an aliphatic bridging group or bridging group comprising one to three atoms with the proviso that at least one of the atoms is a hetero atom, and $Y^2$ is an aromatic group having 6 to 30 carbon atoms, and
15 to 50 weight percent of a third polycarbonate comprising structural units derived from bisphenol A and having a branching level of 0 to less than 2%, and a molecular weight of 17,000 to 40,000 g/mol as measured by gel permeation chromatography using polycarbonate standards, wherein weight percent is based on the combined weight of the first, second and third polycarbonates and the composition has a heat distortion temperature greater than or equal to 145° C., ductility greater than or equal to 90% at 23 degrees C., multi-axial impact greater than or equal to 50 J/m at 23° C., and a molded article of the composition has a UL 94 V0 rating at a thickness of 1.5 mm;

wherein the conversion material is configured to absorb at least a portion of the first wavelength range radiation and emit radiation having a second wavelength range;

wherein the optical component is configured such that at least the first wavelength range radiation passes though the optical component.

30. A light-emitting device, comprising:
a means for emitting radiation having a first wavelength range, wherein the means for emitting radiation is located in a housing, wherein the housing is formed from a plastic composition comprising:
a polycarbonate composition and the polycarbonate composition comprises:
a flame retardant comprising a sulfonate salt;
15 to 50 weight percent of a first polycarbonate, wherein the first polycarbonate comprises structural units of formula (I)

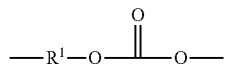

wherein at least 60 percent of the total number of $R^1$ groups comprise aromatic groups and the balance thereof are aliphatic or alicyclic groups, and terminal groups derived from an end-capping agent, wherein the first polycarbonate has a branching level of greater than or equal to 2%, a weight average molecular weight of 20,000 to 55,000 g/mol as measured by gel permeation chromatography using polycarbonate standards, and a peak melt viscosity greater than or equal to 25,000 poise when measured using a parallel plate melt rheology test at a heating rate of 10 degrees C./minute at a temperature of 350 to 450 degree C. at a frequency of 3 radians/second and a strain amplitude of 9%;
20 to 50 weight percent of a second polycarbonate having a glass transition temperature greater than or equal to 170° C., wherein the second polycarbonate comprises structural units derived from HO-$A^1$-$Y^1$-$A^2$-OH and structural units derived from HO-$A^1$-$Y^2$-$A^2$-OH wherein each of $A^1$ and $A^2$ is a monocyclic divalent aryl group, $Y^1$ is an aliphatic bridging group or bridging group comprising one to three atoms with the proviso that at least one of the atoms is a hetero atom, and $Y^2$ is an aromatic group having 6 to 30 carbon atoms, and
15 to 50 weight percent of a third polycarbonate comprising structural units derived from bisphenol A and having a branching level of 0 to less than 2%, and a molecular weight of 17,000 to 40,000 g/mol as measured by gel permeation chromatography using polycarbonate standards, wherein weight percent is based on the combined weight of the first, second and third polycarbonates and the composition has a heat distortion temperature greater than or equal to 145° C., ductility greater than or equal to 90% at 23 degrees C., multi-axial impact greater than or equal to 50 J/m at 23° C., and a molded article of the composition has a UL 94 V0 rating at a thickness of 1.5 mm; and means for absorbing at least a portion of the first wavelength range radiation and emitting radiation having a second wavelength range;

wherein after the means for absorbing has been exposed to the radiation, the means for absorbing has a luminescence lifetime of less than $10^{-4}$ seconds when the radiation exposure stops;

wherein the means for absorbing comprises
greater than 0 ppm of a first material comprising Si, Sr, Ba, Ca, Eu, or a combination thereof; and
less than 50 ppm of a second material comprising Al, Co, Fe, Mg, Mo, Na, Ni, Pd, P, Rh, Sb, Ti, Zr, or a combination thereof.

31. The use of a plastic composition as a housing for a light emitting element, wherein the plastic composition comprises
a polycarbonate composition and the polycarbonate composition comprises:
a flame retardant comprising a sulfonate salt;
15 to 50 weight percent of a first polycarbonate, wherein the first polycarbonate comprises structural units of formula (I)

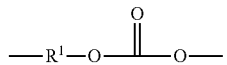

wherein at least 60 percent of the total number of R1 groups comprise aromatic groups and the balance thereof are aliphatic or alicyclic groups, and terminal groups derived from an end-capping agent, wherein the first polycarbonate has a branching level of greater than or equal to 2%, a weight average molecular weight of 20,000 to 55,000 g/mol as measured by gel permeation chromatography using polycarbonate standards, and a peak melt viscosity greater than or equal to 25,000 poise when measured using a parallel plate melt rheology test at a heating rate of 10 degrees C./minute at a temperature of 350 to 450 degree C. at a frequency of 3 radians/second and a strain amplitude of 9%;
20 to 50 weight percent of a second polycarbonate having a glass transition temperature greater than or equal to 170° C., wherein the second polycarbonate comprises structural units derived from HO-A1-Y1-A2-OH and structural units derived from HO-A1-Y2-A2-OH wherein each of A1 and A2 is a monocyclic divalent aryl group, Y1 is an aliphatic bridging group or bridging group comprising one to three atoms with the proviso that at least one of the atoms is a hetero atom, and Y2 is an aromatic group having 6 to 30 carbon atoms, and
15 to 50 weight percent of a third polycarbonate comprising structural units derived from bisphenol A and having a branching level of 0 to less than 2%, and a molecular weight of 17,000 to 40,000 g/mol as measured by gel permeation chromatography using polycarbonate standards, wherein weight percent is based on the combined weight of the first, second and third polycarbonates and the composition has a heat distortion temperature greater than or equal to 145° C., ductility greater than or equal to 90% at 23 degrees C., multi-axial impact greater than or equal to 50 J/m at 23° C., and a molded article of the composition has a UL 94 V0 rating at a thickness of 1.5 mm; and a conversion material, wherein the conversion material comprises
greater than 0 ppm of a first material comprising Si, Sr, Ba, Ca, Eu, or a combination thereof; and
less than 50 ppm of a second material comprising Al, Co, Fe, Mg, Mo, Na, Ni, Pd, P, Rh, Sb, Ti, Zr, or a combination thereof;

wherein after the conversion material has been exposed to an excitation source, the conversion material has a luminescence lifetime of less than 10-4 seconds when the excitation source is removed.

32. A light emitting device, comprising:
a lighting element located in a housing, wherein the housing is formed from a plastic composition comprising:
a polycarbonate composition and the polycarbonate composition comprises:
a flame retardant comprising a sulfonate salt;
15 to 50 weight percent of a first polycarbonate, wherein the first polycarbonate comprises structural units of formula (I)

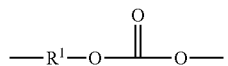

wherein at least 60 percent of the total number of $R^1$ groups comprise aromatic groups and the balance thereof are aliphatic or alicyclic groups, and terminal groups derived from an end-capping agent, wherein the first polycarbonate has a branching level of greater than or equal to 2%, a weight average molecular weight of 20,000 to 55,000 g/mol as measured by gel permeation chromatography using polycarbonate standards, and a peak melt viscosity greater than or equal to 25,000 poise when measured using a parallel plate melt rheology test at a heating rate of 10 degrees C./minute at a temperature of 350 to 450 degree C. at a frequency of 3 radians/second and a strain amplitude of 9%;

20 to 50 weight percent of a second polycarbonate having a glass transition temperature greater than or equal to 170° C., wherein the second polycarbonate comprises structural units derived from HO-$A^1$-$Y^1$-$A^2$-OH and structural units derived from HO-$A^1$-$Y^2$-$A^2$-OH wherein each of $A^1$ and $A^2$ is a monocyclic divalent aryl group, $Y^1$ is an aliphatic bridging group or bridging group comprising one to three atoms with the proviso that at least one of the atoms is a hetero atom, and $Y^2$ is an aromatic group having 6 to 30 carbon atoms, and 15 to 50 weight percent of a third polycarbonate comprising structural units derived from bisphenol A and having a branching level of 0 to less than 2%, and a molecular weight of 17,000 to 40,000 g/mol as measured by gel permeation chromatography using polycarbonate standards, wherein weight percent is based on the combined weight of the first, second and third polycarbonates and the composition has a heat distortion temperature greater than or equal to 145° C., ductility greater than or equal to 90% at 23 degrees C., multi-axial impact greater than or equal to 50 J/m at 23° C., and a molded article of the composition has a UL 94 V0 rating at a thickness of 1.5 mm; and wherein the lighting element further comprises a conversion material, wherein the conversion material comprises yttrium aluminum garnet (YAG) doped with a rare earth element, terbium aluminum garnet doped with a rare earth element, silicate (BOSE) doped with a rare earth element, nitrido silicate doped with a rare earth element; nitride orthosilicate doped with a rare earth element, oxonitridoaluminosilicate doped with a rare earth element, or a combination thereof; and wherein after the conversion material has been exposed to an excitation source, the conversion material has a luminescence lifetime of less than $10^{-4}$ seconds when the excitation source is removed.

\* \* \* \* \*